United States Patent
Holberg et al.

(10) Patent No.: US 7,256,611 B2
(45) Date of Patent: Aug. 14, 2007

(54) CROSS-BAR MATRIX WITH LCD FUNCTIONALITY

(75) Inventors: Douglas R. Holberg, Wimberly, TX (US); Kenneth W. Fernald, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/005,700

(22) Filed: Dec. 7, 2004

(65) Prior Publication Data
US 2005/0206536 A1    Sep. 22, 2005

Related U.S. Application Data

(63) Continuation-in-part of application No. 10/847,632, filed on May 17, 2004, now Pat. No. 7,071,733, which is a continuation of application No. 09/583,260, filed on May 31, 2000, now Pat. No. 6,738,858.

(51) Int. Cl.
*H03K 19/177* (2006.01)

(52) U.S. Cl. .............................. 326/41; 326/38; 326/47
(58) Field of Classification Search ................ 714/324; 712/20; 326/41
See application file for complete search history.

(56) References Cited

U.S. PATENT DOCUMENTS

| | | | | |
|---|---|---|---|---|
| 5,559,971 A | * | 9/1996 | Hsieh et al. | .................. 710/317 |
| 6,262,594 B1 | * | 7/2001 | Cheung et al. | ................ 326/38 |
| 6,416,410 B1 | * | 7/2002 | Abou-Samra et al. | ........ 463/31 |

* cited by examiner

*Primary Examiner*—James C. Kerveros
(74) *Attorney, Agent, or Firm*—Howison & Arnott, L.L.P.

(57) ABSTRACT

A cross-bar matrix includes a plurality of matrix cells arranged in rows and columns wherein each row of cells is associated with a signal input and each column of cells is associated with a common signal output. An enable input controls whether at least a portion of the cells couple a signal on the associated common signal input to a signal output associated with a cell or couple an LCD signal to a signal output and exclude control of the at least portion of said plurality of cells by the control input.

34 Claims, 20 Drawing Sheets

CROSS-BAR MATRIX WITH LCD FUNCTIONALITY

RELATED APPLICATION

This application is a Continuation in Part of U.S. application Ser. No. 10,847,632 filed May 17, 2004 filed U.S. Pat. No. 7,071,733 issued on Jul. 4, 2006 entitled CROSS-BAR MATRIX FOR CONNECTING DIGITAL RESOURCES TO I/O PINS OF AN INTEGRATED CIRCUIT, which is a Continuation of application Ser. No. 09/583,260 filed May 31, 2000, now U.S. Pat. No. 6,738,858 issued on May 18, 2004 entitled CROSS-BAR MATRIX FOR CONNECTING DIGITAL RESOURCES TO I/O PINS OF AN INTEGRATED CIRCUIT, and is related to U.S. Pat. No. 6,839,795 issued on Jan. 4, 2005 entitled PRIORITY CROSS-BAR DECODER.

TECHNICAL FIELD OF THE INVENTION

The present invention relates in general to integrated circuit input/output circuits, and more particularly to a matrix arrangement for providing switched access of a plurality of signals and an LCD driver to I/O ports.

BACKGROUND OF THE INVENTION

The large scale integration of a number of devices or circuits allows numerous functions to be carried out within a single integrated circuit. On the one hand, semiconductor dies or chips can be made larger to accommodate a larger number of circuits and corresponding functions. Conversely, significant improvements in lithography techniques have been achieved in order to make the existing circuits smaller so that additional circuits can be formed within a chip, without utilizing a larger-sized semiconductor chip. In order to utilize the functions provided by the circuits formed within the chip, I/O pins or ports are necessary. In some situations, if additional I/O pins are needed, then they are simply added to the chip as a metallic pad or pin. It can be appreciated that, based on a given size of the semiconductor die, only a reasonable number of I/O pins can be accommodated. Some integrated circuits, especially those that are microprocessor-based, have more than one hundred I/O pins. The I/O pins can be formed not only on the edge of the chip, but also on the planer face of the chip.

A problem exists when there are more signals or functions than corresponding pins available to the integrated circuit. One practice has been to multiplex a few number of signals, such as two or three, with respect to a single I/O pin. The multiplexing is carried out by a simple logic circuit that selects one of the three signals to use the I/O pin at any given time. Although this limited I/O pin sharing feature provides a certain degree of flexibility, there exists other situations in which this solution is not acceptable. There are various applications in which an integrated circuit provides more functions than can be accommodated by a full pin-out integrated circuit. In such situations, it is often the case that not all functions are required at the same time. In other applications, different users require the standard integrated circuit to be packaged with fewer than the standard number of I/O pins. In both applications, the dilemma is not easily overcome.

From the foregoing, it can be seen that a need exists for a technique to improve the flexibility by which the various signals or functions of an integrated circuit device are made available to the I/O pins. Another need exists for a switch matrix that allows many different signals or functions to be applied to many different I/O pins, while yet minimizing the semiconductor area utilized.

SUMMARY OF THE INVENTION

The present invention disclosed and claimed herein, in one aspect thereof, comprises a cross-bar matrix including a plurality of matrix cells arranged in rows and columns. Each row of cells is associated with a common signal input and each column of cells is associated with a common signal output. Each cell includes a control input for controlling whether the cell couples to a signal on the associated common signal input to a signal output associated with the cell such that any signal of a row can be coupled to any signal output. An additional enable input controls whether at least a portion of said plurality of cells couple a signal on the associated common signal input to a signal output associated with the cell or couple a plurality of signal inputs associated with an LCD function to a corresponding plurality of signal outputs and exclude control of the at least portion of said plurality of cells by the control input.

BRIEF DESCRIPTION OF THE DRAWINGS

Further features and advantages will be apparent from the following and more particular description of the preferred and other embodiments of the invention, as illustrated in the accompanying drawings in which like reference characters generally refer to the same parts or elements throughout the views, and in which.

DETAILED DESCRIPTION OF THE INVENTION

Figure 1:
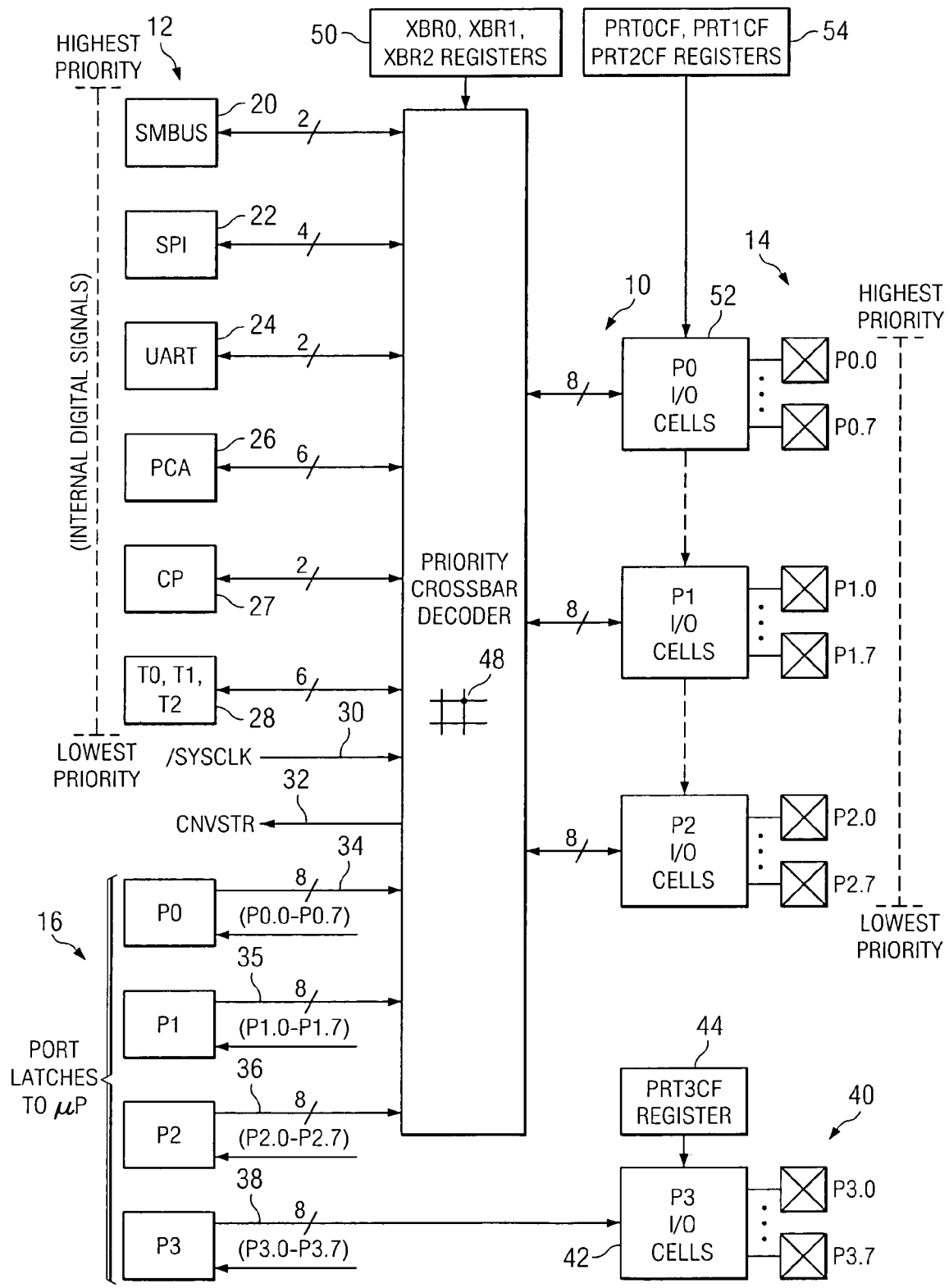
FIG. 1 illustrates a generalized block diagram of the priority cross-bar decoder and support circuits according to the preferred embodiment of the invention.

FIG. 1 illustrates the various digital resources and other support circuits of a semiconductor chip that can be employed and otherwise controlled by a microprocessor (not shown) on the same chip. The aim of any processor system is to couple the digital resources, as well as the I/O ports of the processor itself, to the terminal pins associated with the semiconductor chip. As noted above, most pins of microprocessor chips are assigned one or two functions, but are limited to such functions. This represents a major shortcoming, especially if the semiconductor chip is small in area, thereby leaving very little room for I/O pins.

In FIG. 1, there is shown a priority cross-bar decoder 10 for coupling the digital resources 12 to the various I/O pins 14 of the chip. The priority of each I/O pin is shown. The various digital resources 12, from the highest to lowest priority, include two bits of a system management bus 20, four bits of a serial peripheral interface 22, two bits of a UART 24, six bits of a programmable counter array 26, two bits for a pair of comparators 27, and six bits for various timers 28. Also input to the priority cross-bar decoder 10 is a system clock (SYSCLK) 30. Output from the cross-bar decoder 10 is a conversion start (CNVSTR) signal 32. The priority of the signals of the digital resources is shown. Three 8-bit buses 34-36 are also provided as microprocessor port inputs and outputs to the priority cross-bar decoder 10. A fourth microprocessor bus 38 bypasses the priority cross-bar decoder 10 and is coupled directly to respective eight I/O pins 40 via I/O pin driver circuits 42. The I/O driver circuits 42 are controlled by respective registers 44 in a manner to be described below.

The priority cross-bar decoder 10 includes a number of replicated cells 48 for coupling digital signals from the digital resources 12, based on priority, to the respective I/O pins 14. The priority function of the cross-bar decoder 10 is integrated on the microprocessor chip with logic gates. A number of cross-bar registers (XBR) 50 are written or otherwise controlled by the microprocessor. When the cross-bar registers 50 are written by the microprocessor, the various signals from the digital resources 12 are activated and are passed through the cross-bar decoder 10 to the assigned I/O pins 14. Generally, but not exclusively, a single output of the XBR register 50 is effective to select a group of signals of digital resource 12. In the preferred form of the invention, one cross-bar register output will select the two signals of the digital resource 20, a second cross-bar register output will select the four signals of the digital resource 22, and so on. Other digital resources, such as resource 28, may have each signal thereof selected by a separate cross-bar register output. In practice, there are three 8-bit cross-bar registers, designated XBR0, XBR1 and XBR2. If the first bit of the XBR0 register is enabled and set to a logic one, then both signals corresponding to the SMbus resource 20 are enabled to be routed through the priority cross-bar decoder 10. As can be seen, the particular application involved will dictate the correspondence between the type and number of digital resource signals selected by cross-bar register outputs.

Since the SMbus 20 is assigned the highest priority, the two signals thereof will be automatically routed to highest priority pins, namely pins 0 and 1 of I/O port 0. The I/O pins 14 illustrate three 8-bit ports. The digit to the left of the decimal point illustrates the port number, and the digit to the right of the decimal point illustrates the pin number of that port. The first signal of the SMbus 20 would be routed by the priority cross-bar decoder 10 to port 0, pin 0 (P0.0), and the second signal of the SMbus 20 would be coupled to port 0, pin 1 (P0.1). In practice, if the SMbus 20 was not utilized, then the first two signals of the serial peripheral interface 22 would be coupled respectively to port 0, pins 1 and 2 and the second two signals of the serial peripheral interface 22 would be coupled to port 0, pins 2 and 3. Hence, the lower order port and pins are assigned and utilized for the bidirectional transfer of signals, and any unassigned I/O pins are the lower priority I/O pins. The most unused pin in this scheme is the last or lowest priority pin, namely port 2, pin 7. The existence of any unassigned I/O pin assumes that fewer than twenty-four signals are activated.

It should be noted that the priority cross-bar decoder 10 contains a number of routing circuits or cells 48, each of which has a path that can route digital signals in one direction, and a separate path for passing digital signals in the opposite direction. These two signal paths provide a bidirectional transfer capability to and from the I/O pins 14. In addition, a third path is routed through each cell 48 of the priority cross-bar decoder 10 to provide an enable signal. The state of the enable signal determines whether the I/O pin is configured as an input or an output. Thus, for example, the SMbus digital resource 20 is shown to have two signal buses. Indeed, each signal bus constitutes three separate conductors that are routed through the priority cross-bar decoder 10. This will be described in more detail below.

Coupled between the priority cross-bar decoder 10 and the I/O pins 14 are respective I/O drive circuits 52. The I/O drive circuits 52 can be configured by a number of port registers 54. In the preferred form of the invention, since there are three I/O ports, each with 8 pins associated therewith, there are a corresponding three 8-bit registers, designated PRT0CF, PRT1CF and PRT2CF. The drive circuits 52 can be configured to provide the pins with push-pull capabilities, weak pull-up, or high impedance.

Figure 2:
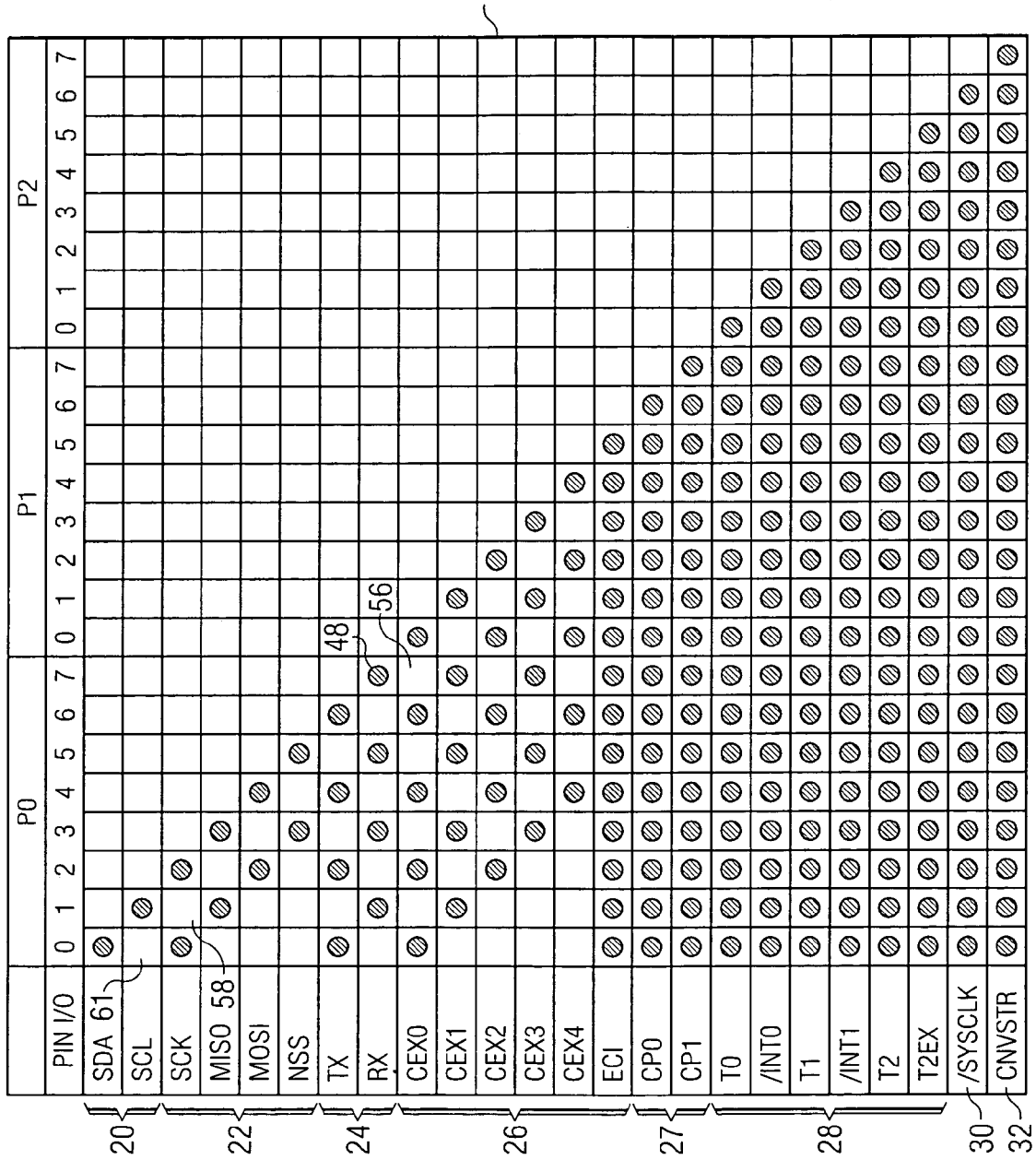
FIG. 2 illustrates a diagram of a priority assignment of various signals to the various I/O pins of the integrated circuit.

With reference to FIG. 2, there is illustrated the priority assignment of the various digital resource signals, as a function of the I/O port pins. Each port pin is shown at the top of the chart of FIG. 2, whereas each digital resource signal is shown in a column at the left of the chart. Each dot, for example dot 48, represents the existence of a cross-bar cell. A blank space, for example space 56, illustrates the absence of a cell. As noted above, the two SMbus 20 signals are assigned the highest priority. In particular, the SDA and SCL signals of the SM bus are given the highest priority, and are assigned respectively to port 0, pins 0 and 1. These two signals always activated together, or not at all, and thus they are assigned different I/O pins. The serial peripheral interface 22 includes four signals, ranked from the highest priority, and identified as SCK, MISO, MOSI and NSS. The SCK signal is assigned port 0, pin 0, if the SDA signal is not used. If the SDA signal is being used, then the SCK signal is assigned port 0, pin 2. As can be seen by the vacant cell 58, the SCK signal can never be assigned to port P0.1. The vacant cells in the chart corresponding to the various signals of digital resources 20, 22, 24 and 26 reduce the number of cells involved, and thus allow the priority cross-bar decoder 10 to be fabricated in a smaller area of semiconductor material.

While a full 24×24 switching matrix of cross-bar cells could be utilized, it has been found that in many applications this is not necessary. Various schemes can be utilized to reduce the number of cross-bar cells in a switching matrix without substantially compromising the flexibility or efficiency. With fewer cells, less semiconductor area is required for the switching matrix. By prioritizing the signals applied to the switching matrix, fewer cells are required. Indeed, the triangular shaped area 60 shown in FIG. 2 is not populated with cross-bar cells, and thus the area required for the matrix is much less than otherwise might be required. Secondly, by enabling pairs or groups of signals from the digital resource, a further reduction in the number of cells is required. Because the two signals (SDA and SCL) of the digital resource 20 are selected as a pair, they can never be both assigned and routed to the same I/O pin. As a result, when the SDA signal is assigned to P(0.0), SCL cannot be assigned to the pin, and thus the cell location 61 for the SCL signal is vacant. The vacant cell locations reduce the area required for implementation of the cross-bar decoder 10. Additionally, any of the "populated" cells in FIG. 2 can be left out, depending upon the functionality that will be associated therewith.

As the signals associated with the chart of FIG. 2 are assigned lower priority, i.e., appear lower in the chart, they have the option of being connectable to a greater number of I/O pins. For example, the signal CNVSTR 32 is coupled to a cross-bar cell located in each column thereof, thereby being able to be routed to each one of the 24 I/O pins. In other words, if the first 23 pins are assigned to signals, the CNVSTR signal 32 can be assigned to pin P2.7, the last and 24th I/O pin.

Figure 3A:
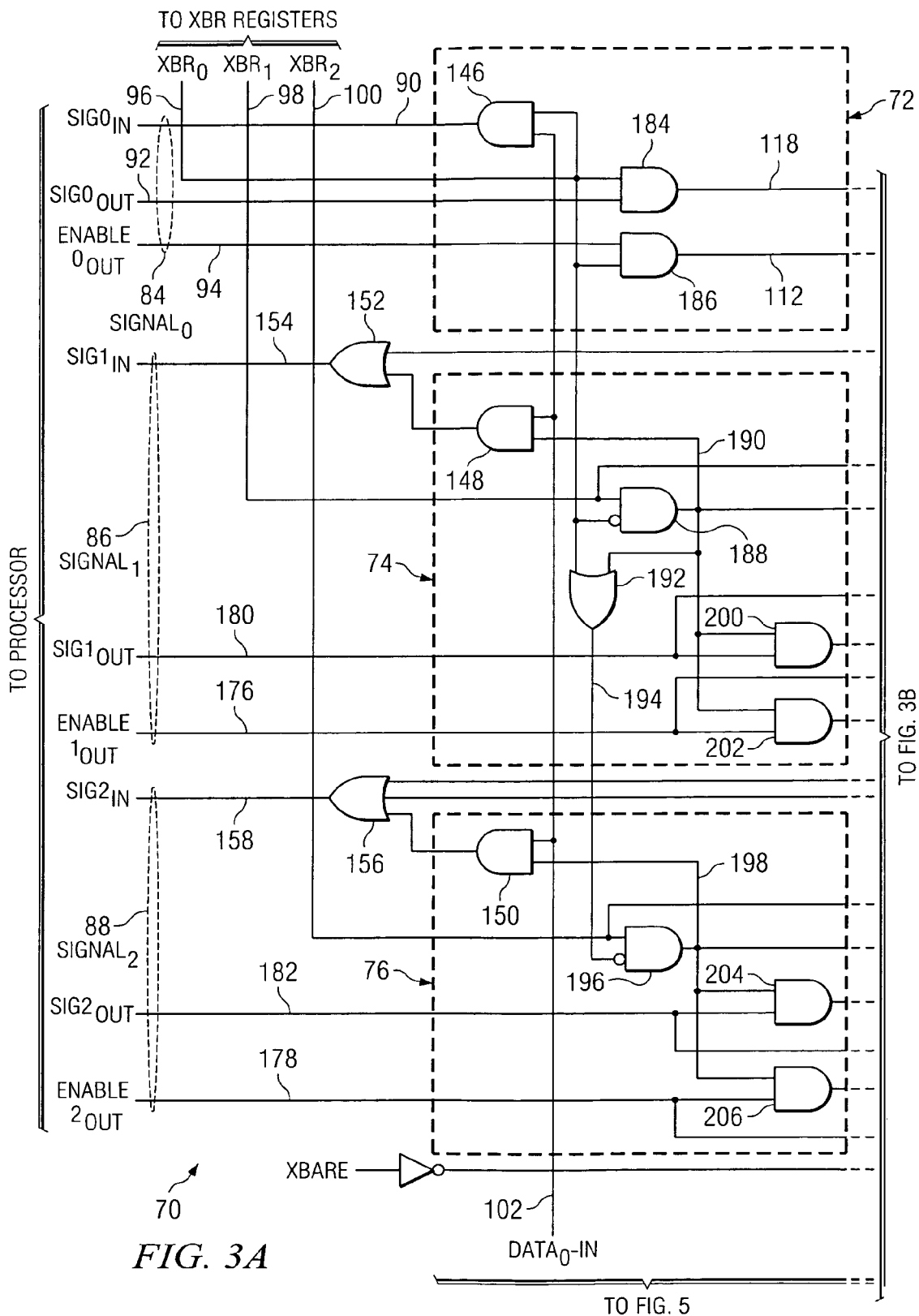
FIG. 3 illustrates a detailed schematic drawing of a priority cross-bar decoder, in which three different signals can be assigned and routed to three different I/O pins.
Figure 3B:
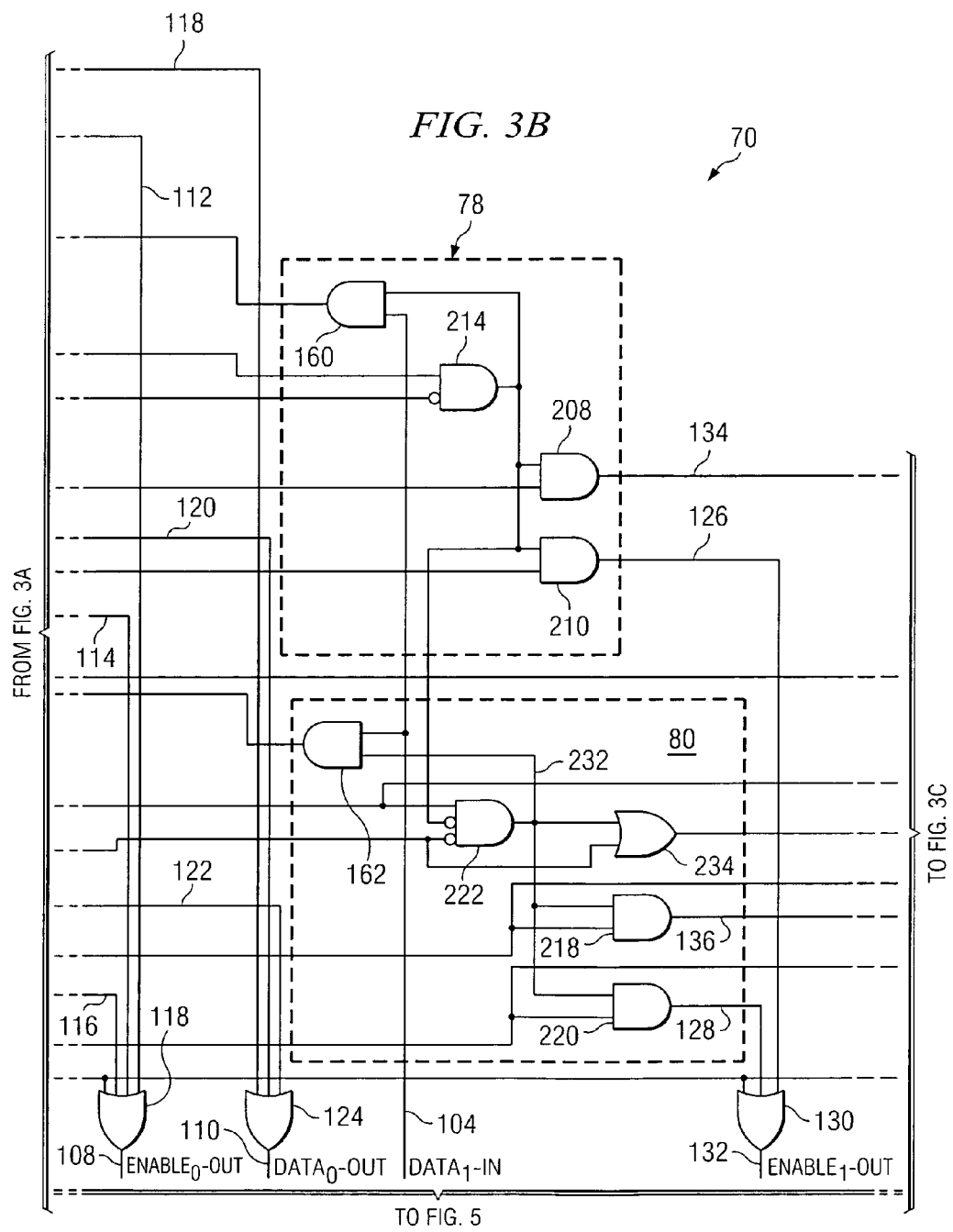
Figure 4:
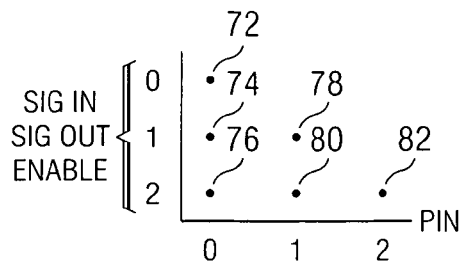
FIG. 4 illustrates a simplified diagram of the various cells of the cross-bar decoder of FIG. 3.
Figure 3C:
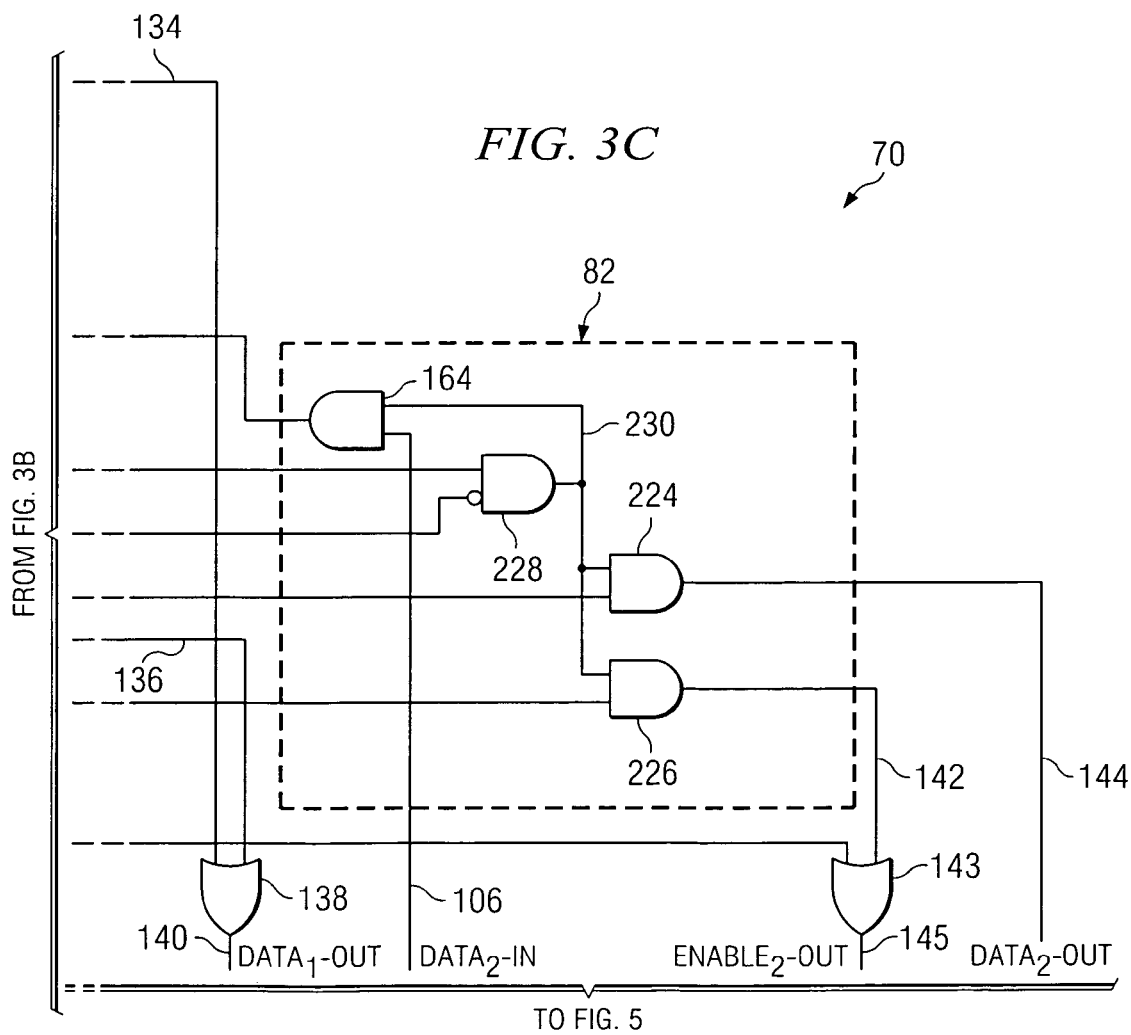
Figure 5:
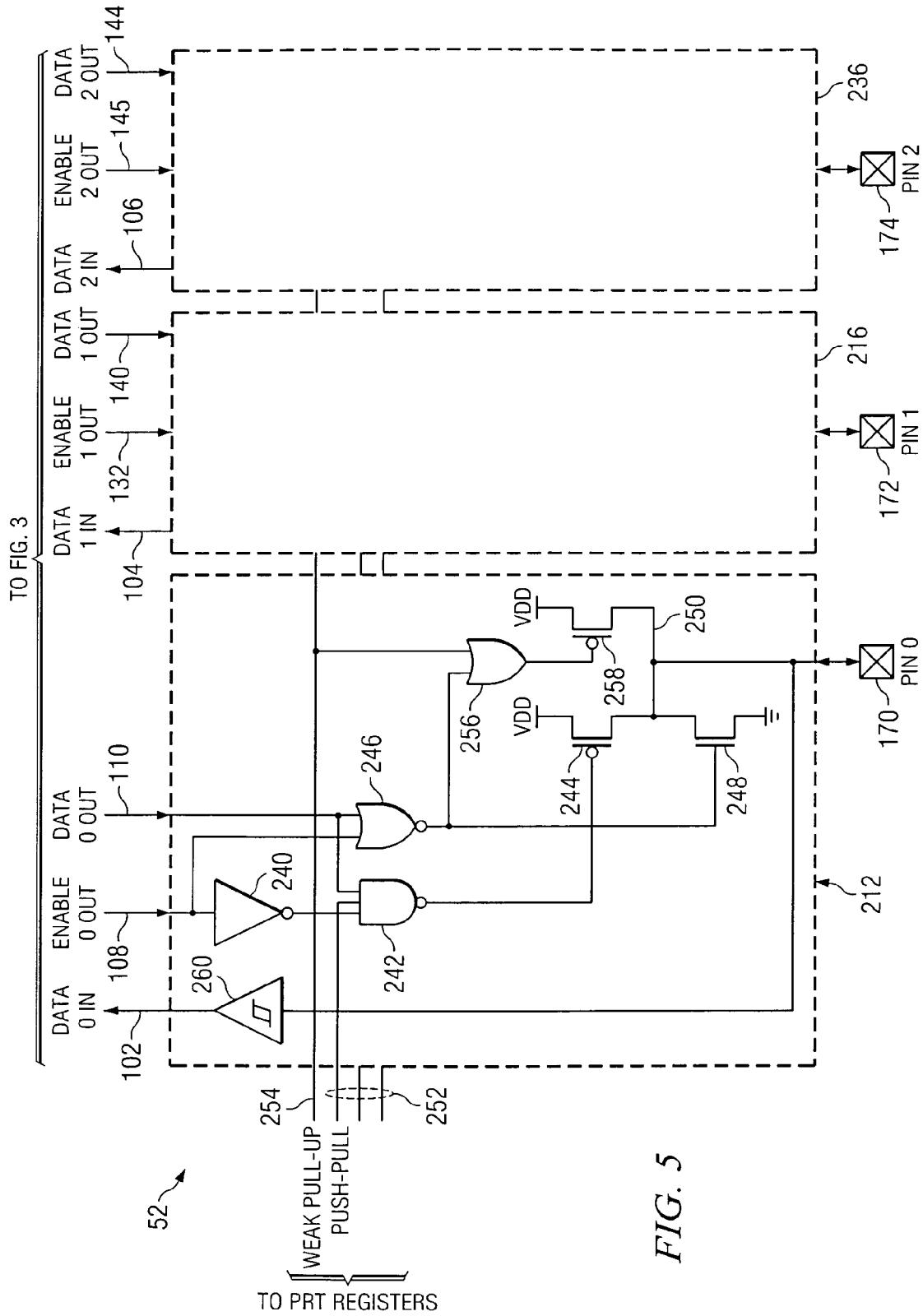
FIG. 5 illustrates the I/O pin driver circuits coupled to the priority cross-bar decoder.

Referring now to FIG. 3, there is illustrated a three-by-three priority cross-bar decoder 70, meaning that three signals are prioritized and can be coupled to three different I/O pins. FIG. 5, when coupled to FIG. 3, illustrates the connections between the cross-bar decoder 70 and the I/O pin driver circuits. The I/O drivers can be configured to provide different functions, as described below. FIG. 4 shows, in simplified form, the priority assignment of the various signals with regard to the I/O pins. The first data resource signal is assigned the highest priority with regard to cell 72, in that it can be connected only through the cross-bar decoder 10 to I/O pin 0. Since the highest priority signal can always be connected to I/O Pin, it is unnecessary to provide optional connections to other I/O pins. As noted above, each signal applied to the cross-bar decoder 70 includes three conductors identified by $Sig_{in}$, $Sig_{out}$ and $Enable_{out}$. Hence, the cross-bar decoder cell 70 carries three switched conductors, each associated with the three respective signals. $Sig0_{in}$, $Sig0_{out}$ and $Enable0_{out}$ are associated with cell 72. $Sig1_{in}$, $Sig1_{out}$ and $Enable1_{out}$ are associated with cross-bar decoder cells 74 and 78, and thus can be coupled to either I/O pin0 or pin 1. Lastly, $Sig2_{in}$, $Sig2_{out}$, and $Enable2_{out}$ are associated with cross-bar decoder cells 76, 80 and 82 and thus can be switched to any of the three I/O pins. If all three digital resource signals are activated by selection of the cross-bar register 50, then the triplet $Signal_0$ 84 would be assigned to Pin0, triplet $Signal_1$ 86 would be coupled through cell 78 to Pin1, and triplet $Signal_2$ 88 would be coupled through cell 82 to Pin 2. Again, if triplet $Signal_0$ 84 was not activated by way of the cross-bar register 50, then triplet $Signal_1$ 86 would be coupled to Pin 0 via cell 74. In like manner, triplet $Signal_2$ 88 would be coupled to Pin 1 by way of cell 80.

The detailed operation of FIG. 3 is next described. It should be realized that the cross-bar register 50 only selects the various digital resource signals, but does not assign any priority to the signals. Rather, the priority cross-bar decoder 70 itself assigns a priority to the signals. The priority assignment of signals to I/O pins can be rearranged should one or more of the digital resource signals be deactivated. The priority is assigned in a ripple-like manner, in that the highest priority I/O pins are first utilized for the transfer of the highest priority signals. Once the highest priority signal that is activated is assigned to I/O Pin 0, then the cross-bar decoder 70 assigns the next highest priority signal that is activated to Pin 1, and so on such that the highest to lowest priority activated signals ripple through the cross-bar decoder 70. If one or more of the digital resource signals are not activated, the lowest priority I/O pins will be unused.

As noted above, cross-bar decoder cell 72 in the first row is associated with triplet signal lines 84. Cross-bar decoder cells 74 and 78 in the second row are associated with triplet signal lines 86. Lastly, cross-bar decoder cells 76, 80 and 82 in the third row are associated with triplet signal lines 88. Each of the triplets of lines includes a signal-in line, a signal-out line and an enable-out line. Generally, the signal-in line functions to transfer signals from an assigned I/O pin to the digital resource 12. The signal-out line is effective to transfer signals from the digital resource 12 to an assigned I/O pin. The enable-out signal is effective to configure the respective I/O pin driver circuit so that data can be either transmitted from or received by the associated pin.

Each priority cross-bar decoder cell in a horizontal row is associated with the respective triplet of signal lines. Each triplet of signal lines is selected by an output of the cross-bar register 50, three of which are shown by reference numerals 96, 98 and 100 in FIG. 3. The first cross-bar register signal $XBR_0$ 96 selects the first signal triplet 84. The second cross-bar register signal $XBR_1$ 98 selects the second signal triplet 86. The third cross-bar register signal $XBR_2$ 100 selects the third signal triplet 88. In other words, if the first triplet 84 of signals is to be selected so that $Sig0_{out}$ is transferred to I/O Pin 0.0, then the $XBR_0$ signal 96 is driven high by the XBR register. The outputs of the XBR registers 50 are set or reset by the microprocessor. Of course, the preferred form of the invention involves twenty-four signal triplets as illustrated in FIG. 2. Because many of the signal triplets are grouped together as separate digital resources, there are a fewer number of cross-bar register outputs to provide corresponding digital levels to select the groups of signal triplets. FIG. 3 shows, in simplified form, only three signal triplets. These signal triplets are not in the same group, and thus a separate XBR output selects the individual signal triplets. However, those skilled in the art can readily expand and replicate the cross-bar decoder cells to accommodate as many signal triplets as desired. When an output of the cross-bar register 50 is driven high, the respective signal triplet is selected and activated.

Each cross-bar decoder cell in the first column, such as column cells 72, 74 and 76, can be connected to a $Data_0$-in signal line 102. In the second column of the cell matrix, cells 78 and 80 can be connected to the $Data_1$-in signal line 104. The last matrix column has only a single cell 82, and thus can be connected to a $Data_2$-in signal line 106. These data-in lines are effective to route data from the respective I/O pin receivers through the priority cross-bar decoder cells, to the data resources 12. The data-in signals follow a path through the priority cross-bar decoder 10 based on the priority encoded therein.

Each matrix cell of the priority cross-bar decoder 70 situated in the first column, namely cells 72, 74 and 76, is provided an $Enable_0$-out signal 108 and a $Data_0$-out signal 110. Each such column cell provides a respective enable output line 112, 114 and 116, all of which are connected to the inputs of an OR gate 118 to provide the $Enable_0$-out signal 108. The column cells 72, 74 and 76 also provide respective data outputs 118, 120 and 122 which are connected to a second output OR gate 124 for providing the $Data_0$-out signal 110. Based on the priority encoded within the column of cells, only one cell in a column is enabled to both receive and transmit data with respect to the I/O pin associated therewith. Hence, only one input to both OR gates 118 and 124 will be active at one time. The other control line connected to the enable OR gates 118, 130 and 143 will be discussed below.

The cells 78 and 80 in the second column of the priority cross-bar decoder 70 also provide respective enable outputs on lines 126 and 128. These two lines 126 and 128 are coupled to an output OR gate 130 to provide an $Enable_1$-out signal 132. In like manner, data outputs 134 and 136 are coupled from cells 78 and 80 to a second output OR gate 138 to provide the $Data_1$-out signal 140. The last column cell 82 provides an $Enable_2$-out signal 142 and a $Data_2$-out signal 144. Since there is only a single cell 82 in the last column of the exemplary matrix, no data output OR gate is required.

As noted above, each column cell receives data from the respective I/O pin driver by way of the data-in lines 102, 104 and 106. Each data-in line, for example line 102 associated with the first column of cells, is connected to an AND gate. $Data_0$-in line 102 is connected to AND gate 146 in cell 72, gate 148 in cell 74 and gate 150 in cell 76. The output of first AND gate 146 in cell 72 is coupled to the $Sig_0$-in line 90. The output of the second AND gate 148 is coupled to an input of an OR gate 152 and produces the $Sig_1$-in signal on line 154. The output of the third AND gate 150 is connected to an input of an OR gate 156 to produce a corresponding signal on the $Sig_2$-in line 158. The $Data_1$-in line 104 of the second column of cells 78 and 80 is coupled to AND gate 160 in cell 78. The output of AND gate 160 is coupled to the other input of OR gate 152. Based on which cell 74 or 78 in the row is made active, the OR gate 152 will provide the selected Data-in signal and route the same to the $Sig_1$-in line 154.

As noted above, the $Data_0$-in signal on line 102 is coupled to the AND gate 150 of cell 76. In cell 80, the $Data_1$-in signal on line 104 is coupled to AND gate 162. The output of AND gate 162 is coupled to another input of the OR gate 156. The $Data_2$-in signal on line 106 is coupled to an AND gate 164 in cell 82. The AND gate 164 has an output coupled to yet another input of the OR gate 156. The selected signal on the OR gate 156 is coupled to the $Sig_2$-in line 158.

The input and output functions of the cross-bar decoder 70 operate in the following manner. For purposes of example, it is assumed that all three cross-bar register signals on lines 96, 98 and 100 are driven to an active high state. This means that these signals on the triplet lines 84, 86 and 88 are selected and will be active, and will be routed in a priority manner to the three output pins shown in FIG. 5. For example, it is further assumed that the I/O pins 170, 172 and 174 are configured to function as output pins. To that end, elementary logic circuits associated with the digital resources 12 will drive the enable lines ($Enable_0$-out, $Enable_1$-out and $Enable_2$-out) to a logic low level. A logic low state thus drives the enable output line 94, the enable output line 176 and the enable output line 178 to a logic low. In certain circumstances, when the I/O pins 170-174 are configured as output pins, the input signal lines $Sig_x$-in lines 90, 154 and 158 couple the signals output from the I/O pins, back to receive circuits in the digital resources 12 to compare the same. The transmitted signal can be compared with the signal returned to determine if bus contention is involved. The data from the digital resources 12 is coupled on the $Sig_x$-out lines 92, 180 and 182 to the respective rows of cells in the priority cross-bar decoder 70.

The priority encoding scheme operates in the following manner. The highest priority signals are coupled in the triplet 84 to the top row of cells of the cross-bar decoder 70. This corresponds to cross-bar cell 72. The next highest priority triplet 86 of signals is coupled to the middle row of the cross-bar decoder 70. This corresponds to cells 74 and 78. The lowest priority of signals is coupled in triplet 88 to the bottom row of cross-bar decoder cells. This corresponds to cells 76, 80 and 82. As noted above, the highest priority signal is coupled to Pin0, the next priority signal is coupled to the next pin which, in the example, is Pin1. The lowest priority of the three signals is coupled to the third pin, Pin2. The connection is carried out in the following manner, again assuming that all three signal triplets 84, 86 and 88 are active.

When the cross-bar register signal $XBR_0$ drives line 96 to a logic high, such level selects transmission AND gates 184 and 186 in cell 72. The $XBR_0$ signal is also coupled to the inverting input of priority AND gate 188 located within cell 74. The output 190 of AND gate 188 is thereby driven to a logic low. The logic high signal of the $XBR_0$ signal and the logic low output 190 of the priority AND gate 188 are coupled to an OR gate 192 in cell 74. With these logic levels, the output 194 of the OR gate 192 is driven to a logic high. The logic high on line 194 is coupled to an inverting input of priority AND gate 196 of cell 76. The output of the AND gate 196 drives line 198 to a logic low. It can be seen that the transmission AND gates 200 and 202 in cell 74 control the coupling therethrough of $Sig_1$-out signal on line 180 and the $Enable_1$-out signal on line 176. With the signal on conductor 190 being driven to a logic low by priority AND gate 188, this disables the signals of the second triplet 86 from being passed through the transmission gates 200 and 202 to the respective output OR gates 118 and 124. In like manner, the output of priority AND gate 196 of cell 76 disables transmission AND gates 204 and 206. This prevents passage therethrough of the $Sig_2$-out signal on conductor 182, and the $Enable_2$-out signal on conductor 178. These two signals cannot thereby be coupled to the output OR gates 118 and 124. As such, the only signal that is passed to the output OR gates 118 and 124 is the highest priority signal, namely, $Sig_0$-out and $Enable_0$-out. These output OR gates couple the respective signals to the first I/O pin 170, via the driver circuit 212. The operation of the driver circuit 212 will be described in more detail below.

The data resource signals carried in the second triplet 86 on lines 180 and 176 are not only coupled to the first cell 74 in the second row, but also to the second cell 78 in such row. As such, the digital signals carried on lines 180 and 176 are coupled to transmission AND gates 208 and 210 in cell 78. The priority AND gate 214 in cell 78 determines whether the $Sig_1$-out and $Enable_1$-out signals will be transferred through the transmission AND gates 208 and 210 to the respective output OR gates 130 and 138. It is noted that in the example, $XBR_1$ drives line 98 to a logic high to thereby select the signals of the second triplet 86. The logic high on line 98 is also carried to the second cell 78 in the row, and particularly to priority AND gate 214. The logic low driven by priority AND gate 188 in cell 74, is coupled to the inverting input of priority AND gate 214 of cell 78. The output of priority AND gate 214 is thus a logic high. This enables transmission AND gates 208 and 210 to route therethrough the two signals on lines 180 and 176 of triplet 86. The outputs of transmission AND gates 208 and 210 are coupled on respective lines 134 and 126 to the output OR gates 130 and 138. These logic signals are also coupled to Pin1, designated by reference numeral 172, via the driver circuit 216.

It is noted that the two signals on lines 182 and 178 of the third triplet 88 are not coupled through the respective transmission AND gates 218 and 220 of the third row cell 80. The reason for this is that the logic high output produced by priority AND gate 214 in cell 78 is coupled to the inverting input of priority AND gate 222 of cell 80. The output of priority AND gate 222 thus drives a logic low to the respective inputs of transmission AND gates 218 and 220. Thus, the two signals of triplet 88 on lines 182 and 178 are not passed via the output OR gates 130 and 138 to Pin1.

From the foregoing operation of the priority cross-bar decoder 70 described thus far, it can be seen that a cell, such as cell 72, ranked with the highest priority, disables all other cells therebelow in the column, namely cells 74 and 76. The signals assigned the next priority, such as those of triplet 86, pass to the next column of cells, namely cell 78, since the first cell 74 of that row was disabled. Cell 78 is configured to route the digital signals to the second output pin, and also to disable the cell therebelow in the column, namely cell 80. Thus, cells 72 and 78 are enabled to pass the signals to the respective I/O pins1 and 2, but cells 74, 76 and 80 are disabled.

With regard to the third triplet 88 of signals, such signals are carried on lines 182 and 178 through the first two cells (76 and 78) in the bottom row, to cell 82. These two signals are coupled respectively to transmission AND gates 224 and 226. It is noted from the example that the third triplet 88 of signals are selected and made active by reason of the cross-bar signal $XBR_2$ being driven high. This logic high is carried on line 100 through cells 76 and 78 to a priority AND gate 228 of cell 82. Whether the two signals of triplet 88 are carried through the transmission AND gates 224 and 226 is determined by the output 230 of priority AND gate 228. As noted above, the non-inverting input of priority AND gate 228 is a logic high, as driven by the $XBR_2$ signal. The output of priority AND gate 222 (cell 80) on line 232 is coupled to one input of OR gate 234. The other input of OR gate 234 is driven by the output 198 of the priority AND gate 196 of cell 76. The input 198 of priority AND gate 222 of disabled cell 80 is a logic low. With both inputs of OR gate 234 being driven to logic low states, the output thereof is also a logic low. The output of OR gate 234 is coupled to an inverting input of priority AND gate 228 of cell 82. With a logic high on the non-inverting input, and a logic low on the inverting input of priority AND gate 228, the output 230 thereof is driven to a logic high. The logic high on output 230 enables transmission AND gates 224 and 226 in cell 82. Hence, the two signals on input lines 182 and 178 pass through the transmission AND gates 224 and 226 of cell 82 to the I/O pin, namely Pin2. Again, these two signals are coupled via the driver circuit 236 to the third pin (Pin2). From the foregoing, the priority cross-bar decoder 70 automatically couples input signals in a priority manner to the first pin, second pin and third pin of the integrated circuit.

If, for example, the signals of the second triplet 86 are not made active, then the priority cross-bar decoder 70 automatically takes this into consideration and shifts the third triplet 88 signals to the second I/O pin (Pin1), rather than the third I/O pin. The signals of the second triplet 86 are made inactive by driving output $XBR_1$ of the XBR registers 50 to a logic low state. Hence, a logic low will exist on line 98, which line is coupled to the priority AND gate of cell 74, as well as priority AND gate 214 of cell 78. For the same reasons described above, signals of the first triplet 84 will be routed through the transmission AND) gates 184 and 186 of cell 72 through intermediate circuitry to the first I/O pin (Pin0). Again, circuitry of cell 72, which is the highest priority cell, disables the transmission AND gates of the cells therebelow, namely cells 74 and 76. With the cross-bar register output $XBR_1$ output 98 driven to a logic low, the input of priority AND gate 214 of cell 78 is also driven to a logic low. The output of the priority AND gate 214 is thus at a logic low level. This logic low level disables transmission AND gates 208 and 210 of cell 78, thereby preventing passage therethrough of the two signals of the second triplet 86. Hence, cells 74 and 78 in the second row are both disabled. Signals of the second triplet 86 are thus not routed through the priority cross-bar decoder 70.

With reference to cell 76, it is noted that such cell is disabled by the action of the top priority cell 72. As such, the output of the priority AND gate 196 is a logic low. This logic low is coupled to an inverting input of priority AND gate 222 of cell 80. The other inverting input of priority AND gate 222 is also at a logic low, because this logic level is produced by the output of priority AND gate 214 of cell 78. The non-inverting input of priority AND gate 222 of cell 80 is at a logic high, as this is the logic level of the $XBR_2$ signal. As such, the output of priority AND gate 222 is at a logic high state, thereby enabling the transmission AND gates 218 and 220. When enabled, the transmission AND gates 218 and 220 pass the two signals of the triplet 88 to the output OR gates 130 and 138. These two signals of the third triplet 88 are thus routed to the second I/O pin, namely Pin1. When the second triplet 86 signals are made inactive, the third triplet 88 signals are thus shifted from the third I/O pin to the next higher priority pin, namely Pin2.

With reference to OR gate 234 of cell 80, it is noted that one input is a logic high and the other input is a logic low. As such, the output thereof is a logic high, which logic state is coupled to the inverting input of priority AND gate 228 of cell 82. The output of priority AND gate 228 is thus a logic low, thereby disabling transmission AND gates 224 and 226 of such cell. Hence, neither the $Sig_2$-out or the $Enable_2$-out signals carried on lines 182 and 178 are passed to the driver circuit 236 of the third pin (Pin2).

Without encumbering this description with the details, those skilled in the art can readily verify that if the first triplet 84 of signals are made inactive, the second triplet 86 signals are shifted to first pin (Pin0) and the third triplet 88 signals are shifted to the second pin (Pin1). If, on the other hand, the first triplet 84 and the second triplet 86 signals are made inactive, the cells 72, 74, 78, 80 and 82 are disabled. With this arrangement, the signals of the third triplet 88 are routed via cell 76 to the first I/O pin (Pin0). It can thus be seen that the highest priority signals are coupled to the highest priority pins, and if any signal is absent, lower order priority signals are shifted to use the I/O pins having the next highest priority. Lower priority pins may thus be unused when some of the signals are inactive.

The foregoing describes the operation of the priority cross-bar decoder 70 when the I/O pins are configured as output pins. When the $Enable_x$-out signals of the three triplets are driven to a logic high level, the respective driver circuits 212, 216 and 236 configure the I/O pins as inputs to receive data from external devices. In the preferred form, some I/O pins can be configured as inputs, while at the same time other I/O pins can be configured as outputs. This is achieved by driving the various $Enable_x$-out signals to corresponding states.

It is further noted that other types of logic circuits can be employed to carry out the foregoing priority routing of signals. Instead of employing AND gates 146 and 184, conventional bidirectional transmission gates can be used. In this event, the output OR gates 124 can be eliminated.

Reference is now made to FIG. 5 where there is shown in detail one pin driver circuit 212. The other driver circuits 216 and 236 are constructed and operate in an identical manner. The triplet signals on lines 102, 108 and 110 associated with the first column of the cross-point decoder 70, are coupled to the driver circuit 212 of the first pin, Pin0. The second triplet of signals on lines 104, 132 and 140 associated with the second column of the cross-bar decoder 70 are coupled to the second pin driver 216. Lastly, the third triplet of signals carried on lines 106, 145 and 144 are coupled to the third driver 236 associated with the third I/O pin.

When the XBARE signal of FIG. 3 is driven to a logic low, the output of enable OR gates 118, 130 and 143 are driven to logic high states. In FIG. 5, the logic high state is coupled through an inverter 240 to present a logic low on an input of NAND gate 242. The output of the NAND gate 242 drives a P-channel driver transistor 244 of a push-pull driver, thereby turning it off. The output 108 of the enable OR gate 118 also drives an input of a NOR gate 246 in the pin driver circuit 212. The output of the NOR gate 246 drives an N-channel driver transistor 248 of the push-pull driver to a low level, thereby turning it off. As a result, push-pull output 250 of the driver transistors 244 and 248 is in a high impedance state, which state is coupled to the corresponding I/O pin 170. Thus, when the XBARE signal is at a logic low state, all of the I/O pins are driven to a high impedance state. This feature can be advantageously used when XBRx select signals applied to the priority cross-bar decoder 70 are "settling out" to a stable state. This prevents temporary-state and glitches from appearing at the I/O pins. However, when the XBARE signal is low during this transition period, no erroneous signals will appear at the I/O pins. Those skilled in the art may also utilize additional circuits connected to the P-channel driver transistor 244 and the N-channel driver transistor 248 to prevent both such transistors from being driven into conduction at the same time. Moreover, those skilled in the art may find that not all drivers should be driven into a high impedance state at the same time. Rather, by coupling the XBARE signal to different ones of the OR gates 118, 130 and 143, some drivers may be operational, and others may be configured to a high impedance state.

With reference again to the I/O driver 212, it is noted that if the driver is configured to an operational state, in which logic level on line 108 is at a low level, output pin 170 can be given to the logic level corresponding to the data on the line 110. As noted in FIG. 5, $Data_0$-out signal on line 110 is coupled to an input of NOR gate 246, as well as to an input of the NAND gate 242. For purposes of example, it is assumed that the driver transistors 244 and 248 are to be operated in a push-pull manner. Accordingly, the push-pull control line 252 is driven to a logic high level. Assuming further that the logic level on the $Data_0$-out line 110 is a logic high, then the output of the NOR gate 246 will be logic low, thereby turning off the N-channel driver transistor 248. On the other hand, the output of the NAND gate 242 will be at a logic low level, thereby turning the P-channel driver transistor 244 on. The I/O pin 170 will thus be driven to a logic high state, corresponding to the logic state on the $Data_0$-out line 110.

If, on the other hand, the logic state on the $Data_0$-out line 110 is at a logic low level, then the output of the NOR gate 246 will be logic high level. The output of the NAND gate 242 will be at a logic high level also. The P-channel driver transistor 244 will thus be turned off, while the N-channel driver transistor 248 will be driven into conduction. The logic state that the I/O pin will thus be at a logic low level, corresponding to the logic state on the data line 110.

In the event that the I/O pin 170 is to be provided with a weak pull-up, then the line 254 is driven to a logic low state. If the output of the NOR gate 246 is also at a logic low level, the OR gate 256 will drive the P-channel driver transistor 258 into conduction. The pull-up transistor 258 is constructed with a long channel, thereby providing a high resistance between the supply voltage VDD and the I/O pin 170. A weak pull-up to the I/O pin 170 is thus provided. The weak pull-up control lines 252 and 254 are coupled to all the driver circuits, and are controlled by way of the XBR registers 50. Each driver circuit 212, 216 and 236 is controlled with a push-pull control signal line, one shown as reference number 252. These push-pull control lines are controlled by the PRT registers 54. In order to configure the I/O pin 170 for input of digital signals, the $Enable_0$-out signal on line 108 is driven to a logic high state. As noted above, both transistors 244 and 248 are turned off, thereby placing the I/O pin 170 in a high impedance state. Accordingly, external signals can be applied to the I/O pin 170. The input signals are coupled through a receiver 260, and therethrough to the $Data_0$-in line 102. With reference to FIG. 3, the input data signals on line 102 are coupled to the AND gates 150, 148 and 146 of the respective cross-bar decoder cells 76, 74 and 72. In the first example described above, all three triplet signals 84, 86 and 88 are active. Since the triplet 84 is of the highest priority, the other cells in the column under cell 72 are disabled by virtue of the outputs of the priority AND gates 188 and 196 being at a logic low level. At these corresponding logic low levels, the inputs of AND gates 148 and 150 are also at a logic low, thereby disabling transfer therethrough of the incoming data signal on line 102. However, the control input of AND gate 146 is at logic high, thereby allowing the signal on line 102 to pass therethrough and be routed to the $Sig_0$-in line 90. Data can thus be coupled on line 90 to the corresponding digital resource. As can be appreciated, the same priority applies to signals received by the cross-bar decoder 70 from the I/O pins, as with signals transferred from the cross-bar decoder 70 to the corresponding I/O pins.

In like manner, the input signal coupled from I/O pin 172 pass through the AND gate 160 of cell 78 to the line 154 of triplet 86. The AND gate 162 of cell 80 is disabled, by virtue of the output 232 of the priority AND gate 222 being driven to a logic low level. Lastly, any digital signal input via I/O pin 174 is coupled through the AND gate 164 of cell 82, and thus passes to the gate OR 156 and is coupled to the $Sig_2$-in line 158. A similar analysis can be carried out to verify that, depending upon which cells are enabled or disabled, data signals on the $Data_0$-in line 102 can be transferred via respective AND gates 148 or 150 to the $Sig_x$-in line of either the second triplet 86 or the third triplet 88. The $Data_1$-in signals on line 104 can also be coupled via AND gate 162 to the third triplet 88.

As noted in FIG. 2, not all cell locations of the priority cross-bar decoder 10 need be populated with a cross-bar cell.

Figure 7:
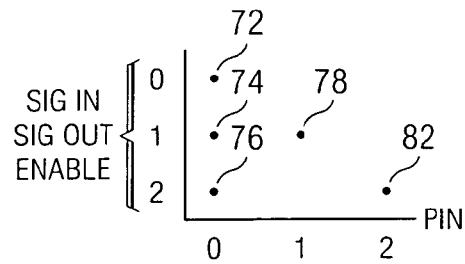
FIG. 7 illustrates a simplified diagram of the cross-bar decoder of FIG. 6.
Figure 6A:
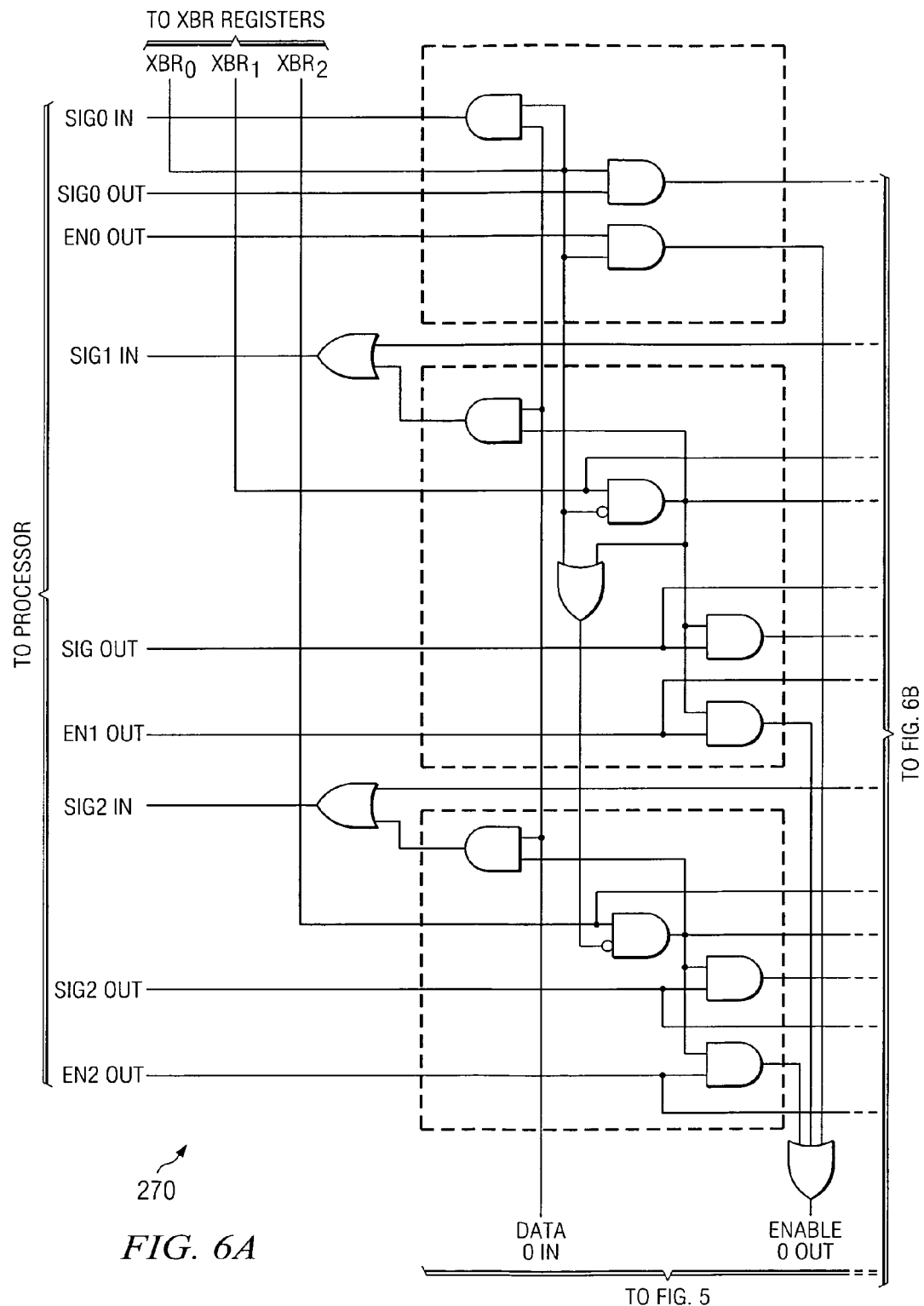
FIG. 6 illustrates the priority cross-bar decoder of FIG. 3, but without one cell of the matrix.
Figure 6B:
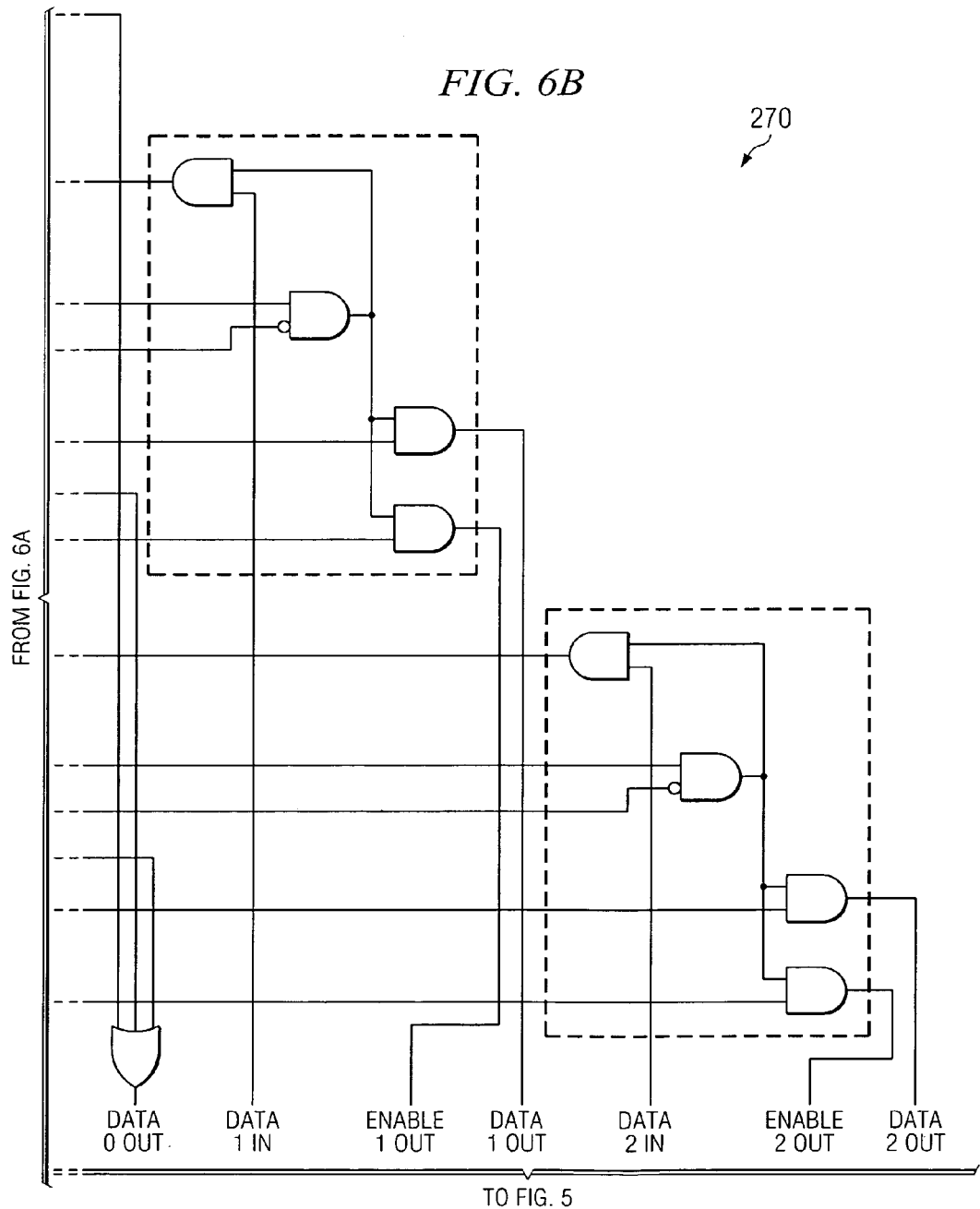

Rather, some spaces 56 are vacant. This means that the corresponding digital resource signal CEX0 cannot be coupled to P0.7. FIGS. 6 and 7 depict a priority cross-bar decoder 270 similar to that shown in FIG. 3, but where cell location 80 is vacant. As a result, the signal lines extending laterally from cell 76 are coupled directly to the corresponding inputs of cell 82. As a result of this vacant cell location, the signals from the third triplet 88 cannot be coupled to the second I/O pin, Pin1. The operation of the priority cross-bar decoder 270 is otherwise the same as that described above in connection with FIG. 3.

Figure 8A:
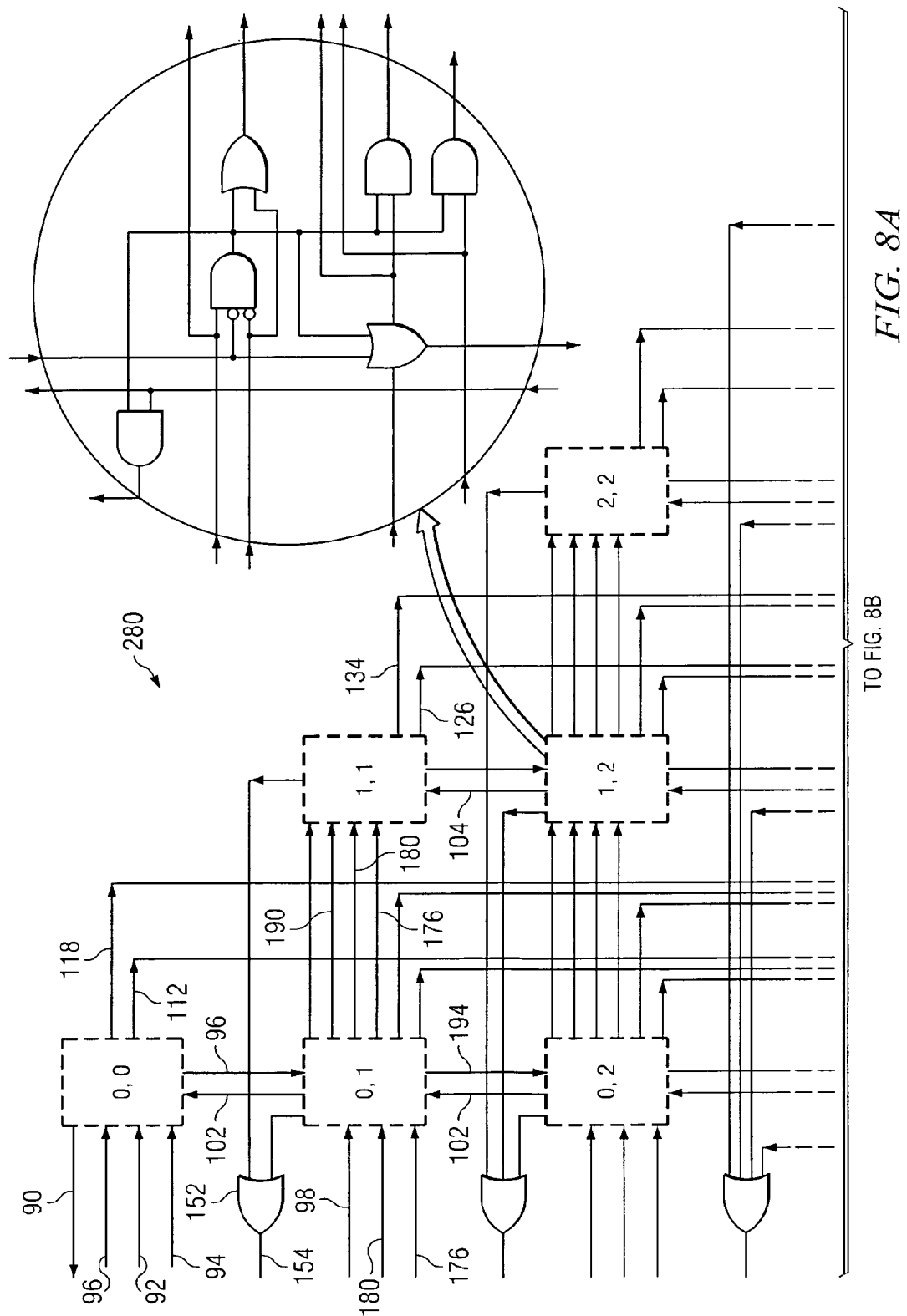
FIG. 8 illustrates a four-by-five matrix of cross-bar decoder cells, with various circuits shown in enlarged form.
Figure 8B:
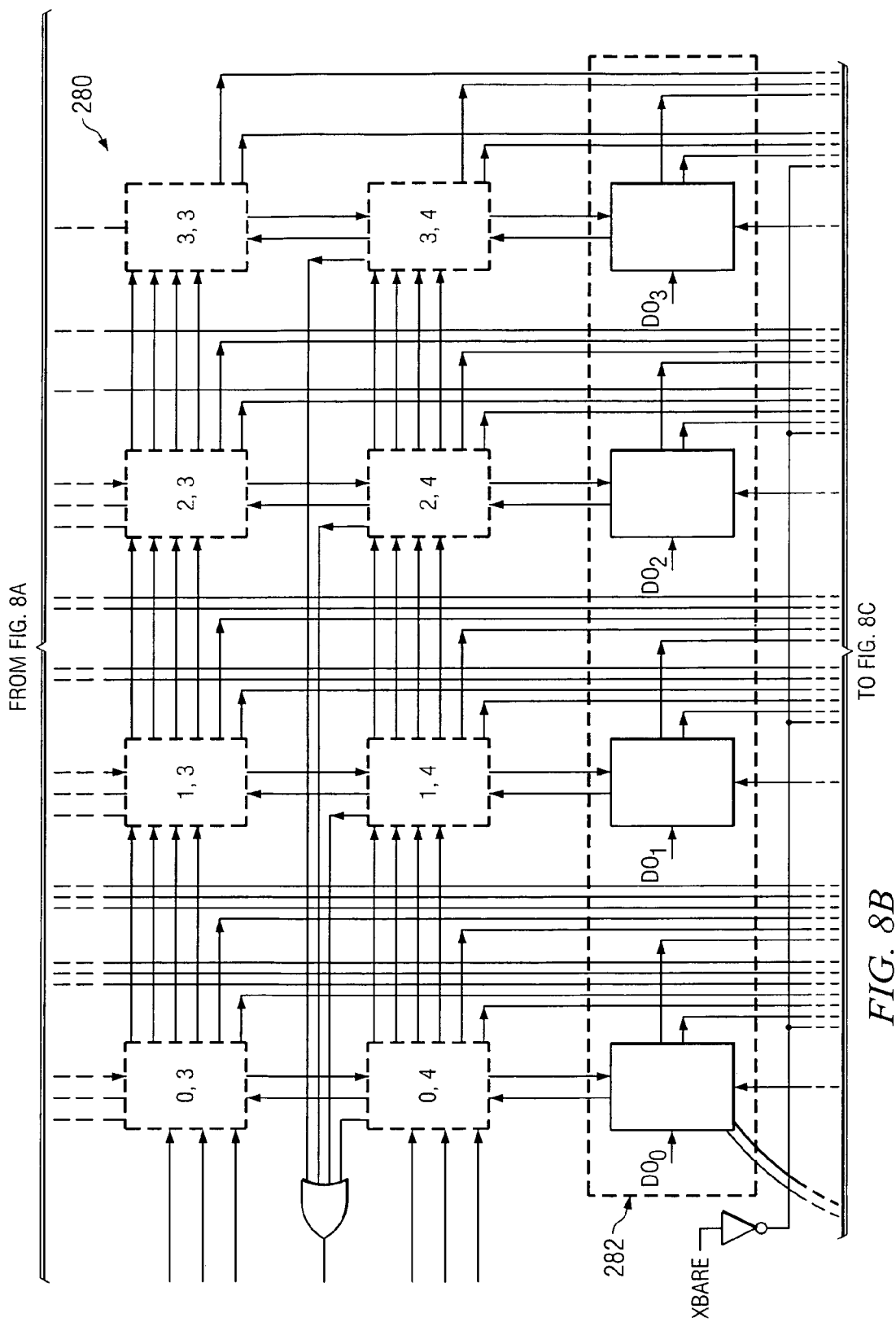
Figure 8C:
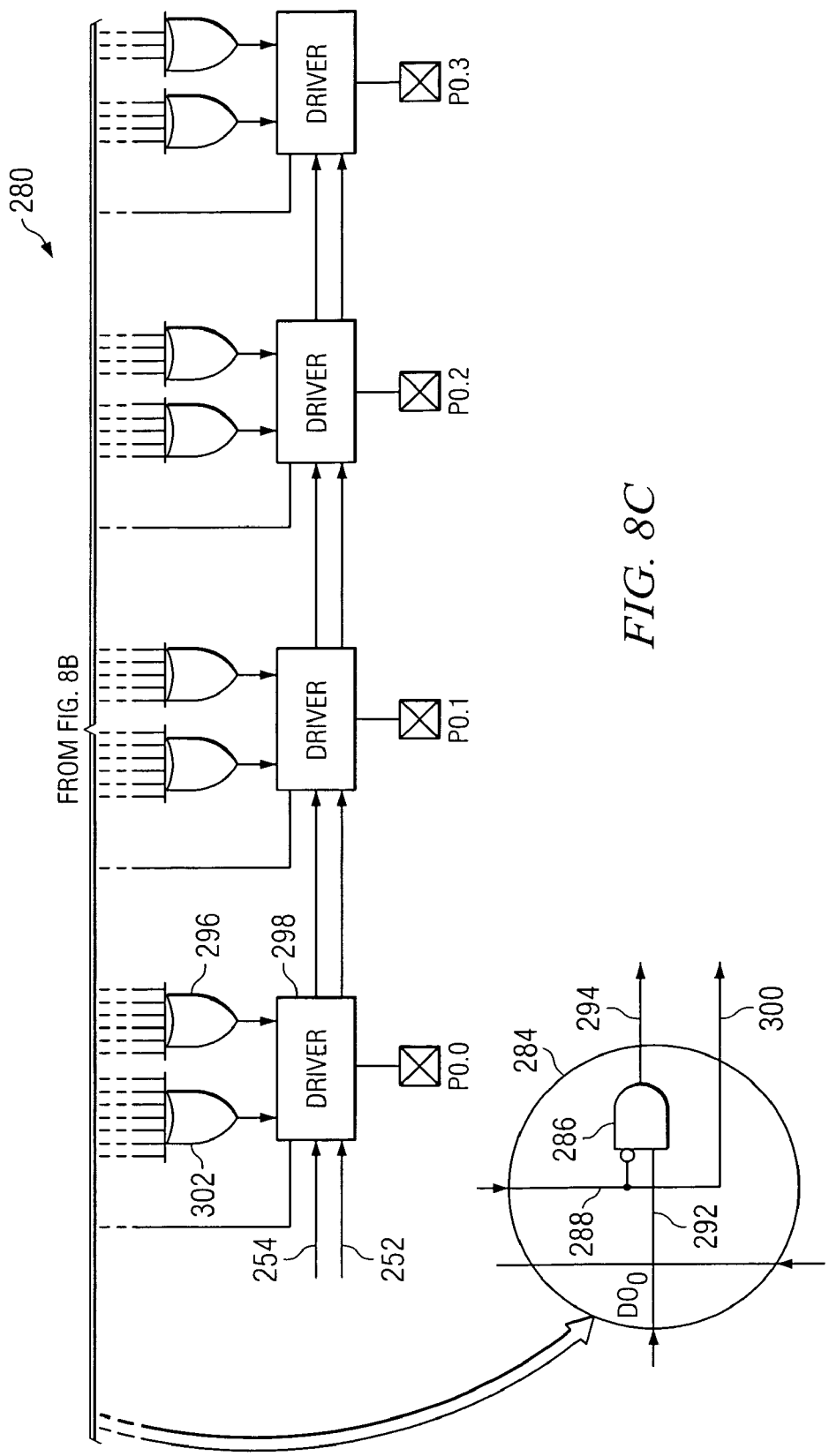

FIG. 8 illustrates a 5×4 matrix of priority cross-bar decoder cells. Many of the fourteen cells are similar to those shown above in connection with FIG. 3. For example, cell 0,0 of matrix 280 is identical to cell 72 of FIG. 3. Cells 0,1 and 1,1 of matrix 280 are similar to respective cells 74 and 78 of matrix 70. Cells 0,2 and 0,3 are similar to cell 74 and, cell 3,3 is similar to cell 78. Cell 0,4 is similar to cell 76, and cells 1,4 and 2,4 are similar to cell 80. Lastly cell 3,4 is similar to cell 82. Cells 1,2 and 1,3 and 2,3 of the matrix 280 are bounded by other neighbor cells, and are shown in enlarged form. The matrix of priority cross-bar decoder cells are otherwise operated in the same manner described above in connection with FIG. 3.

The priority cross-bar decoder 280 of FIG. 8 includes yet other features which could be incorporated in the embodiment shown in FIG. 3. For example, the priority cross-bar decoder 280 could include default circuits 282, one of which is shown in enlarged form as reference numeral 284. The default circuits 282 route the signals of the microprocessor port latches 16 to control the driver circuits in the event that no other cross-bar signal is assigned to the driver circuit. This allows all unassigned I/O pins to serve as general purpose digital I/O. This aspect of the invention is shown in FIG. 1, where the microprocessor port latches 16 are coupled to the priority cross-bar decoder 10 by way of eight-bit lines 34, 35 and 36. With reference again to FIG. 8, the default circuits 282 include four identical circuits, each coupled to a respective data bit $DO_0$-$DO_3$. These four data bits are coupled from four outputs of a port data latch 16 (FIG. 1). It should be noted that the drivers shown in FIG. 8 are identical to those noted above in connection with FIG. 5. An alternative embodiment could utilize an additional level of multiplexing between the cross-bar $Data_x$-outputs and the pin driver circuits. These multiplexers could be controlled by the microprocessor to override the cross-bar outputs and thereby directly control the driver circuits with the port latch registers.

An enlargement of one override circuit is shown as reference numeral 284. Here, the $DO_0$ data bit is applied from the microprocessor port latch 16 to one input of AND gate 286. Enable control line 288 is coupled to an inverting input of AND gate 286, as well as to an enable output directed to the enable OR gate 302. The enable control line 288 is coupled from the cell (0,4) located thereabove. In the example, cell (0,4) is similar to cell 76 shown in FIG. 3. The enable control line 288 would be an extension of conductor 194 which constitutes the output of the OR gate 192 in cell 74 of such figure. In any event, when one or more of the cross-bar register outputs ($XBR_x$) is driven to a logic low, enable control line 288 is also driven low. As a result, any data applied to the $DO_0$ input 292 of the override circuit 284 is coupled to the AND gate output 294. The output of the AND gate 294 is coupled through the output OR gate 296 to the driver 298. Hence, any digital signal applied to the data input 292 of the AND gate 286 is coupled by the driver 298 to the output Pin 0.0.

It is noted that the priority of the digital resource signals is assigned by connecting the highest priority signal as the first signal triplet 84 to the cross-bar decoder 70. The next highest priority signal triplet 86 is then connected as the second signal triplet to the cross-bar decoder 70, and so on. There may be applications where the priority of the signals from the digital resources should be changed during processing. In this event, shifting or rearranging circuits at the signal input of the cross-bar decoder 70 can be utilized to shift or otherwise substitute or rearrange the input signals to different inputs of the cross-bar decoder 70. With such a signal rearranging circuit, the priority of the signals can be changed during processing.

Figure 9A:
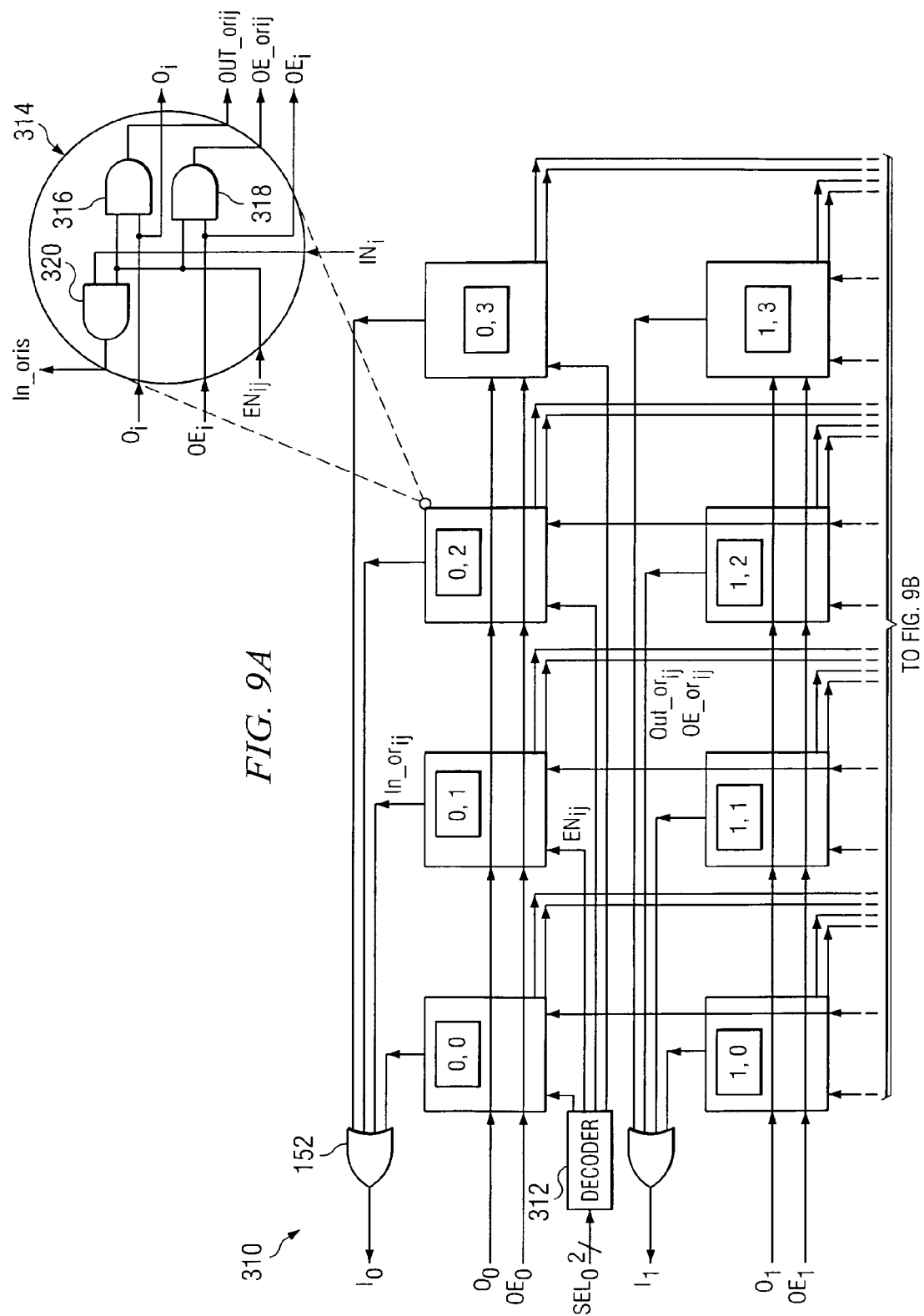
FIG. 9 illustrates a matrix of routing cells for routing data resource signals to I/O pins, without the use of priority.
Figure 9B:
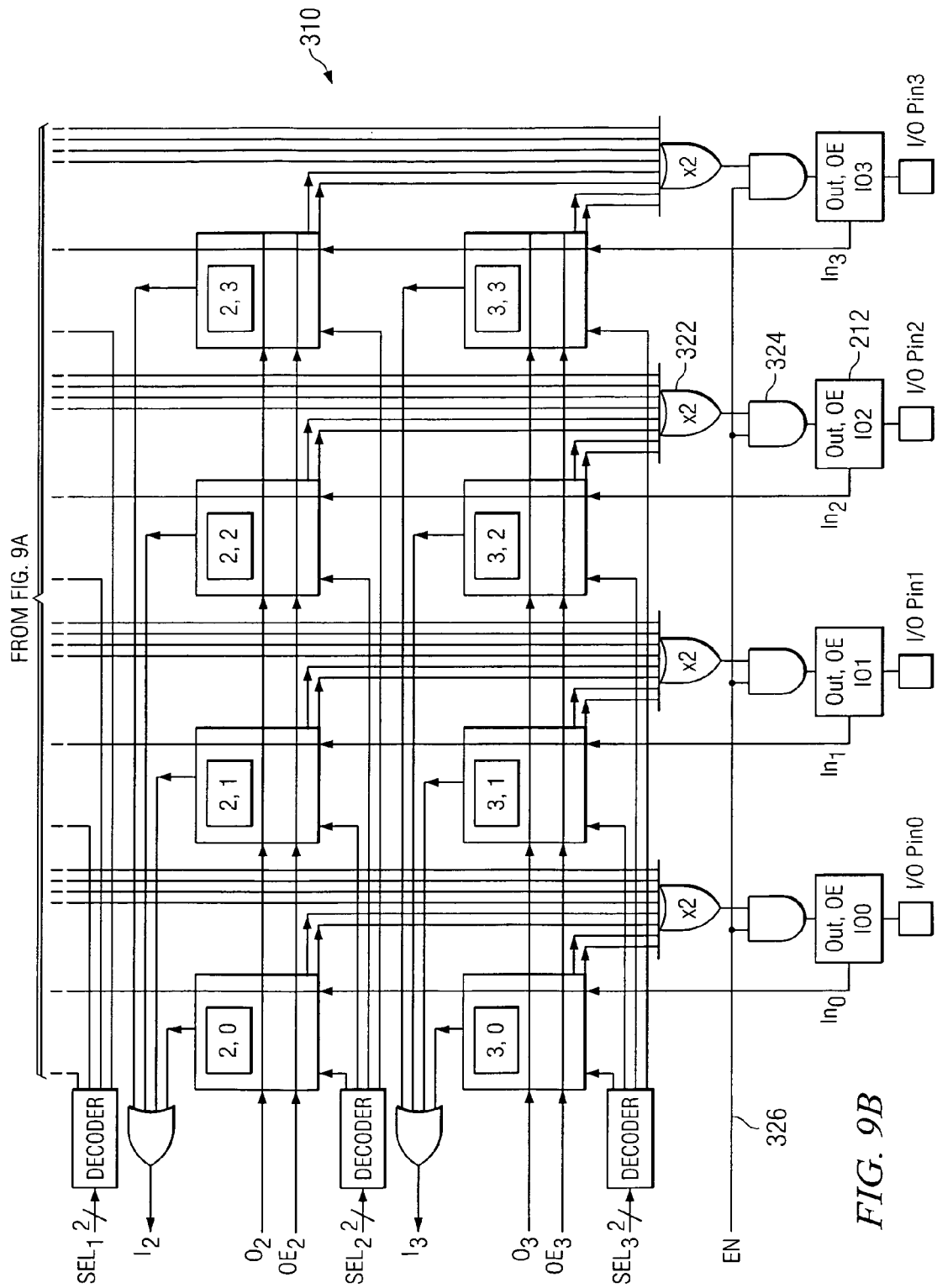

FIG. 9 is a diagram of a general cross-bar decoder 310 for the assignment of digital resource signals to I/O pins in a microcontroller application. The signals to be assigned connect along the rows of the array 310. The I/O pins to be assigned connect down the columns. Each cell shown connects a triplet of signals to its associated I/O pin, depending on the logic state of its $En_{ij}$ enable input. In general, the enable controls for each cell of a row will be generated by a decoder 312 associated with the row. The input to each decoder 312 is written with logic states by microcontroller software which establishes the desired signal-to-pin assignment. In the example of the decoder 310 illustrated, there are four cells in a row, and thus the decoder 312 would be written with four logic states corresponding to which cells of the row will be enabled and which cells will not be enabled to route the triplet signals. The specific details of the decoders 312 are strictly a function of the type of signals to be assigned. Typically, the decoder 312 would be designed such that at most only one of its $En_{ij}$ outputs can be asserted active at a given time. However, in some cases, it may be desirable to assign a signal triplet to multiple I/O pins simultaneously. Also, although the general case shows each signal triplet having its own decoder 312, signals which must be assigned in groups could share a single decoder 312. In such circumstances, certain cells in the array 310 will in fact never be activated and hence could be removed from the array without altering the operation of the cross-bar decoder 310. As in the priority cross-bar decoders described above, the AND gates in the cells can be replaced with bidirectional transmission gates (and the OR gates which generate the pin Out and OE signals can be removed).

Each array cell can be constructed identically. One cell 314 is shown in detail in the enlargement. The data input from the digital resource is identified as $O_i$. The enable input to the cell 314 is $OE_i$. The data and enable inputs from the digital resource are daisy-chained to each cell in a row. The output of the decoder 312 is input to the cell as signal $En_{ij}$. The $En_{ij}$ signal, when at a logic high state, enables the AND gates 316 and 318 to route the respective input signals to corresponding output OR gates, two of which are shown as reference characters 322. The $En_{ij}$ signal also enables AND gate 320 to route signals from the respective I/O pin through the cell 314 to the digital resource circuits. A bidirectional transfer of signals can thus be accomplished with each cell of the cross-bar decoder 310.

An AND gate 324 receives the outputs of both the OR gates 322 of the column for coupling such signals to the I/O pin driver circuit 212. A signal on control line 326 can disable the AND gate 324 to inhibit the column signals from being transferred to the pin driver 212. The various other features of the priority cross-bar decoders described above can be utilized in conjunction with the decoder 310.

When the cross-bar decoder 310 is integrated with a digital controller, a great degree of flexibility is achieved in assigning the digital resource signals to the different I/O pins.

Figure 10A:
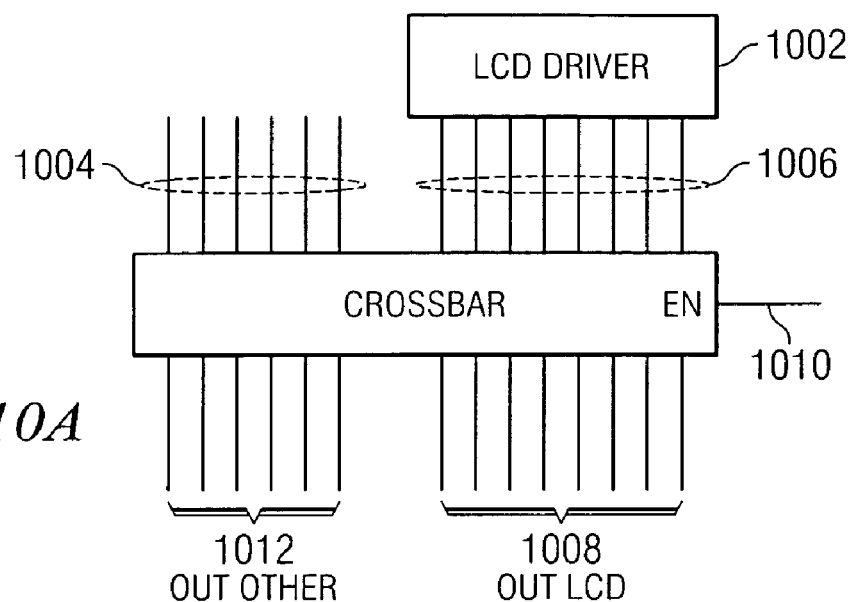
FIG. 10a is a block diagram illustrating a cross-bar having an LCD functionality.

FIG. 10 is a block diagram of an alternative embodiment illustrating the connection of an LCD driver 1002 connected to the priority cross-bar decoder 10 of the present disclosure. As described previously with respect to FIGS. 1-9, the priority cross-bar decoder 10 operates to provide a connection to output pins from various digital inputs. The embodiment described with respect to FIG. 10, while still providing inputs 1004 that can be assigned to a number of digital input devices based upon the priorities of the input devices also includes a number of inputs 1006 which may be dedicated to an LCD driver 1002. When providing inputs to the priority cross-bar decoder 10 via LCD driver 1002, a number of the output pins 1008 must be dedicated to the LCD driver 1002 to provide a driving output signal. Thus, the output pins 1008 dedicated to the LCD driver 1002 are no longer available to be assigned to various digital devices by the priority cross-bar decoder 10. This process is controlled by an enable input 1010 which when actuated by a user desiring to program the priority cross-bar decoder 10 to support an LCD driver 1002 causes the cells within the cross-bar switch which would normally be assigned based upon a priority to digital input devices to be dedicated to the LCD driver 1002. When the enable pin 1010 has been activated, only output pins 1012 are available for assignment to the digital input devices based upon a priority level. This is facilitated through the use of a configuration register. A single bit defuses the LCD functionality and, when set, the LCD associated output pins become dedicated to that function.

Figure 10B:
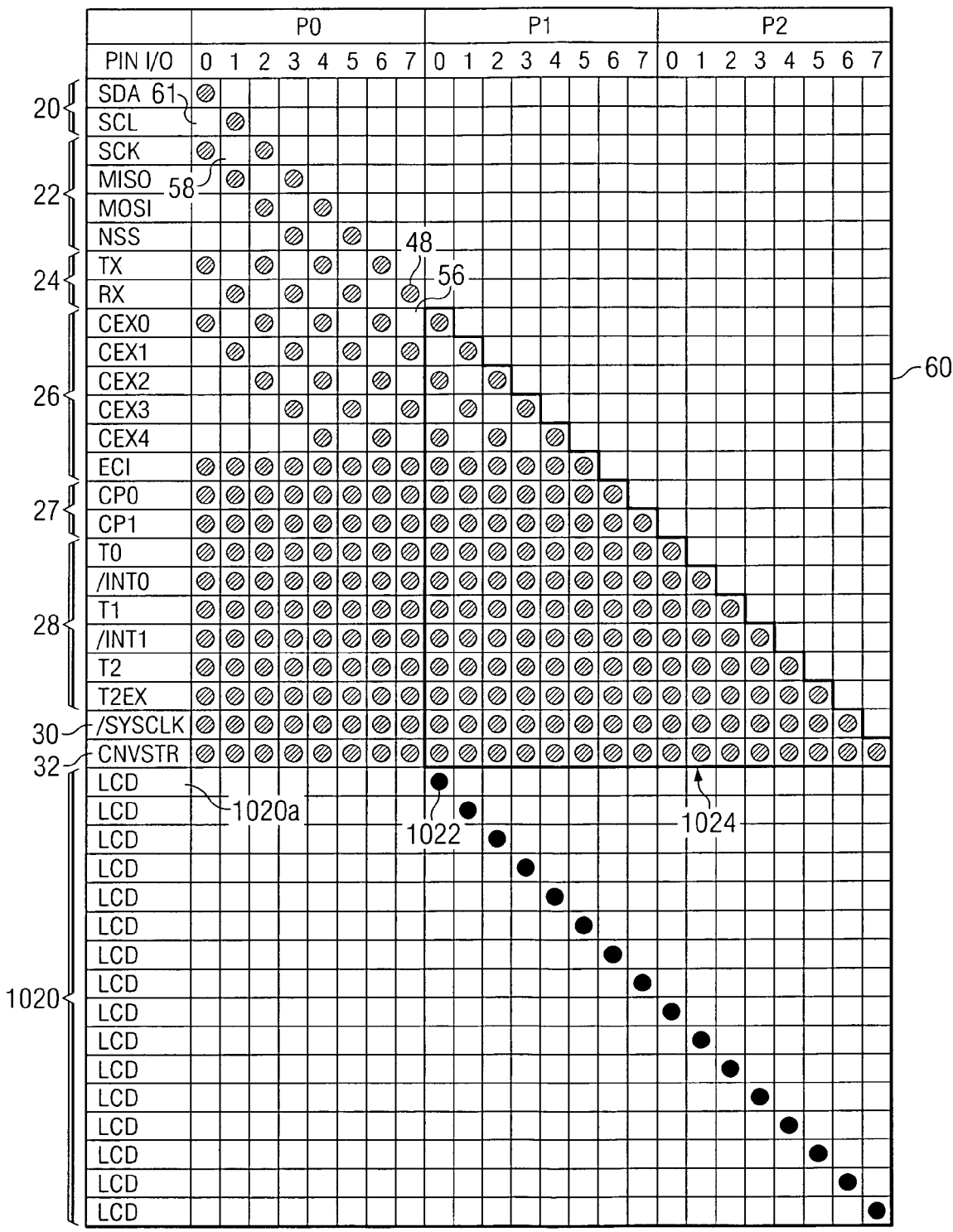
FIG. 10b illustrates a diagram of a priority assignment of various digital signals and LCD signals to the various I/O pins of the integrated circuit.

With reference to FIG. 10b, there is illustrated the priority assignment of the various digital resource signals and LCD signals, as a function of the I/O port pins. Each port pin is shown at the top of the chart of FIG. 10b, whereas each digital resource signal is shown in a column at the left of the chart. Each dot, for example dot 48, represents the existence of a cross-bar cell. A blank space, for example space 56, illustrates the absence of a cell. As noted above, the two SMbus 20 signals are assigned the highest priority. In particular, the SDA and SCL signals of the SM bus are given the highest priority, and are assigned respectively to port 0, pins 0 and 1. These two signals are always activated together, or not at all, and thus they are assigned different I/O pins. The serial peripheral interface 22 includes four signals, ranked from the highest priority, and identified as SCK, MISO, MOSI and NSS. The SCK signal is assigned port 0, pin 0, if the SDA signal is not used. If the SDA signal is being used, then the SCK signal is assigned port 0, pin 2. As can be seen by the vacant cell 58, the SCK signal can never be assigned to port P0.1. The vacant cells in the chart corresponding to the various signals of digital resources 20, 22, 24 and 26 reduce the number of cells involved, and thus allow the priority cross-bar decoder 10 to be fabricated in a smaller area of semiconductor material.

As the signals associated with the chart of FIG. 10b are assigned lower priority, i.e., appear lower in the chart, they have the option of being connectable to a greater number of I/O pins. For example, the signal CNVSTR 32 is coupled to a cross-bar cell located in each column thereof, thereby being able to be routed to each one of the 24 I/O pins when available. In other words, if the first 23 pins are assigned to signals, the CNVSTR signal 32 can be assigned to pin P2.7, the last and 24th I/O pin.

The LCD signals 1020 are assigned based upon the logical level of the LCD enable signal. When the LCD enable signal is at a first logical level the LCD signals are given the highest priority on ports P1 and P2. (Note that, in this example, the LCD driver needs only sixteen pins. However, a more realistic number is sixty-four.) Each of the LCD signals are assigned to specific pins. For example, the LCD signal 1020a is assigned to port 0, pin 1 at 1022 and no further cells are needed for assigning LCD signal 1020a within the crossbar switch. The remaining LCD signals are assigned in a similar fashion. When the LCD enable signal causes the LCD signals to be assigned the area represented by 1024 is no longer available for assignment to the digital signals. Thus, all the cells represented by the circles in area 1024 are no longer able to assign digital signals to this area including ports P1 and P2, and the digital signals are only assignable to port P1, while the LCD signals are assigned to ports P1 and P2. (Note that this assignment also has a specific sequence.) When the LCD enable signal is at a second logical level, the LCD signals 1020 are assigned to none of the ports and the digital signals are assigned to all of the ports of the crossbar switch according to their priority as discussed herein above.

While the FIG. 10b illustrates the LCD signals 1020 being assigned to ports P1 and P2, the LCD signals 1020 may be assigned to any combination of ports or to all of the ports. When any port is dedicated to the LCD signals, the pins on that port may no longer be assigned to digital signals on a priority bases.

Figure 11:
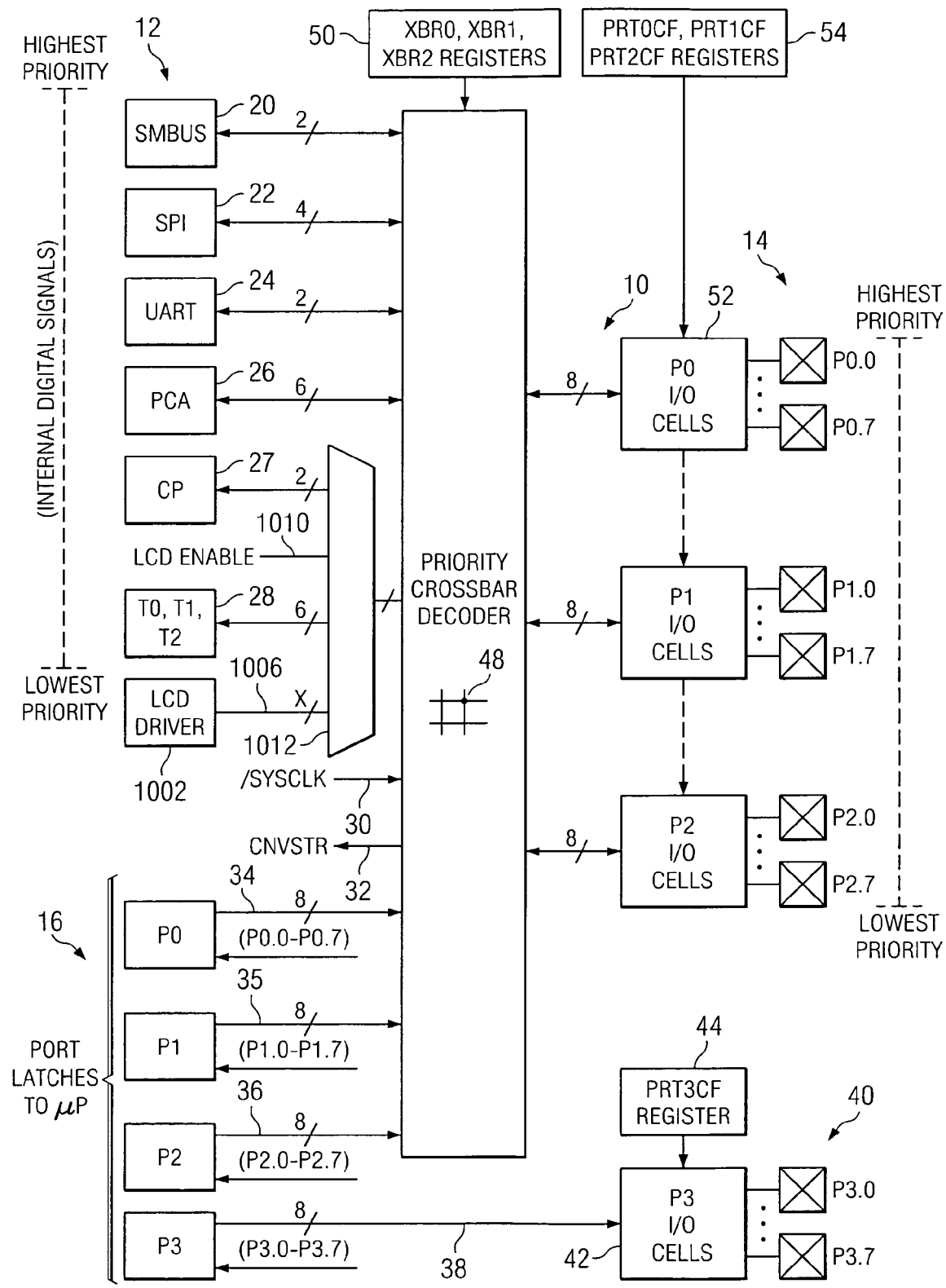
FIG. 11 is a diagram illustrating the priority assignment of internal digital signals and LCD signals to the cross-bar decoder of the present disclosure.

Referring now to FIG. 11, there is illustrated the priority cross-bar decoder 10 according to one embodiment of the present disclosure. The illustration in FIG. 11 is similar to that as described with respect to FIG. 1. The only differences between the illustration in FIG. 11 and that of FIG. 1 are the inclusion of x inputs from an LCD driver 1002 connected to a multiplexer 1012 via a bus 1006 which may include any number of lines necessary to drive an LCD. Also connected to the multiplexer 1012 are a portion of the internal digital signals. In this case, the comparators 27 and the timers 28 are connected to the multiplexer 1012. However, any number of internal digital signals maybe connected to the multiplexer 1012. The LCD enable line 1010 is also connected to the multiplexer 1012. Thus, the LCD driver 1002 inputs may preempt the inputs of some or all of the internal digital signals. When the signal on the LCD enable line 1010 is low, the priority cross-bar decoder 10 operates in the manner described with respect to FIG. 1 and the internal digital signals are assigned to various output pins in the manner previously described. However, when the LCD enable line 1010 is high, one or more of the ports 52 are dedicated to providing an LCD output from the LCD driver 1002. Internal digital signals may no longer be assigned to the ports which are now dedicated to the LCD driver 1010.

Figure 13:
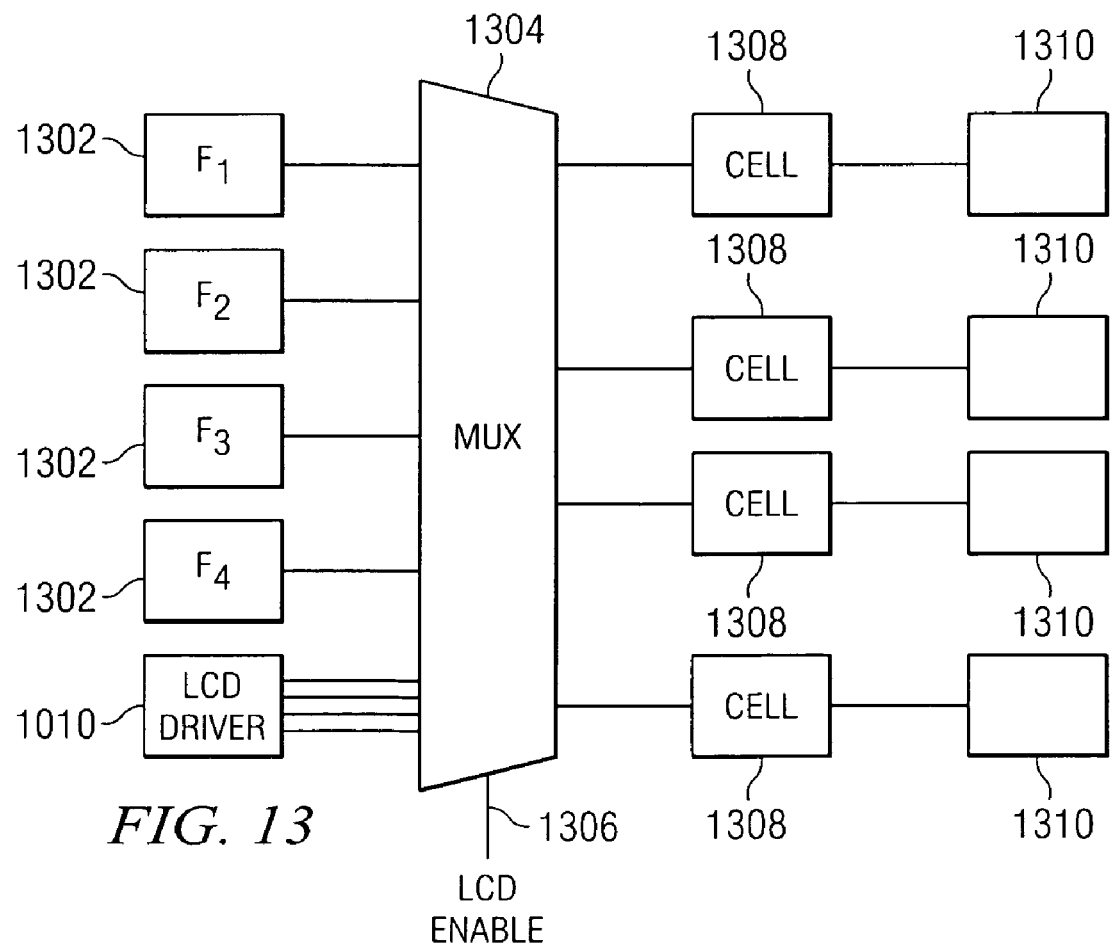
FIG. 13 illustrates the interconnection between a number of cells of the cross-bar decoder to provide digital inputs to a plurality of output pins and LCD driver inputs to the plurality of output pins.
Figure 12A:
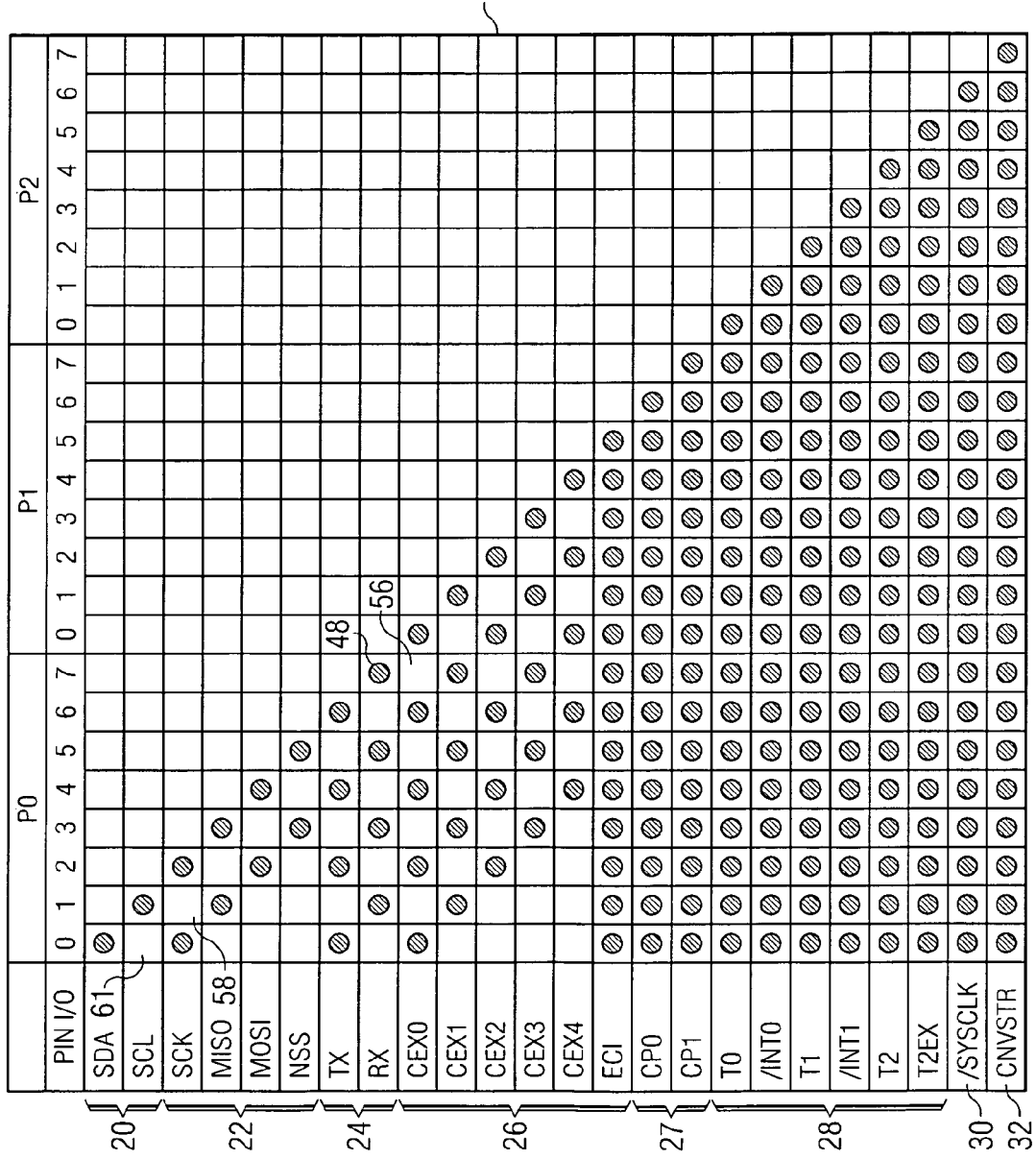
FIG. 12 is an illustration of the manner of operation of the priority to cross-bar decoder providing various digital functions to output pins and additionally providing an LCD driver functionality.
Figure 12B:
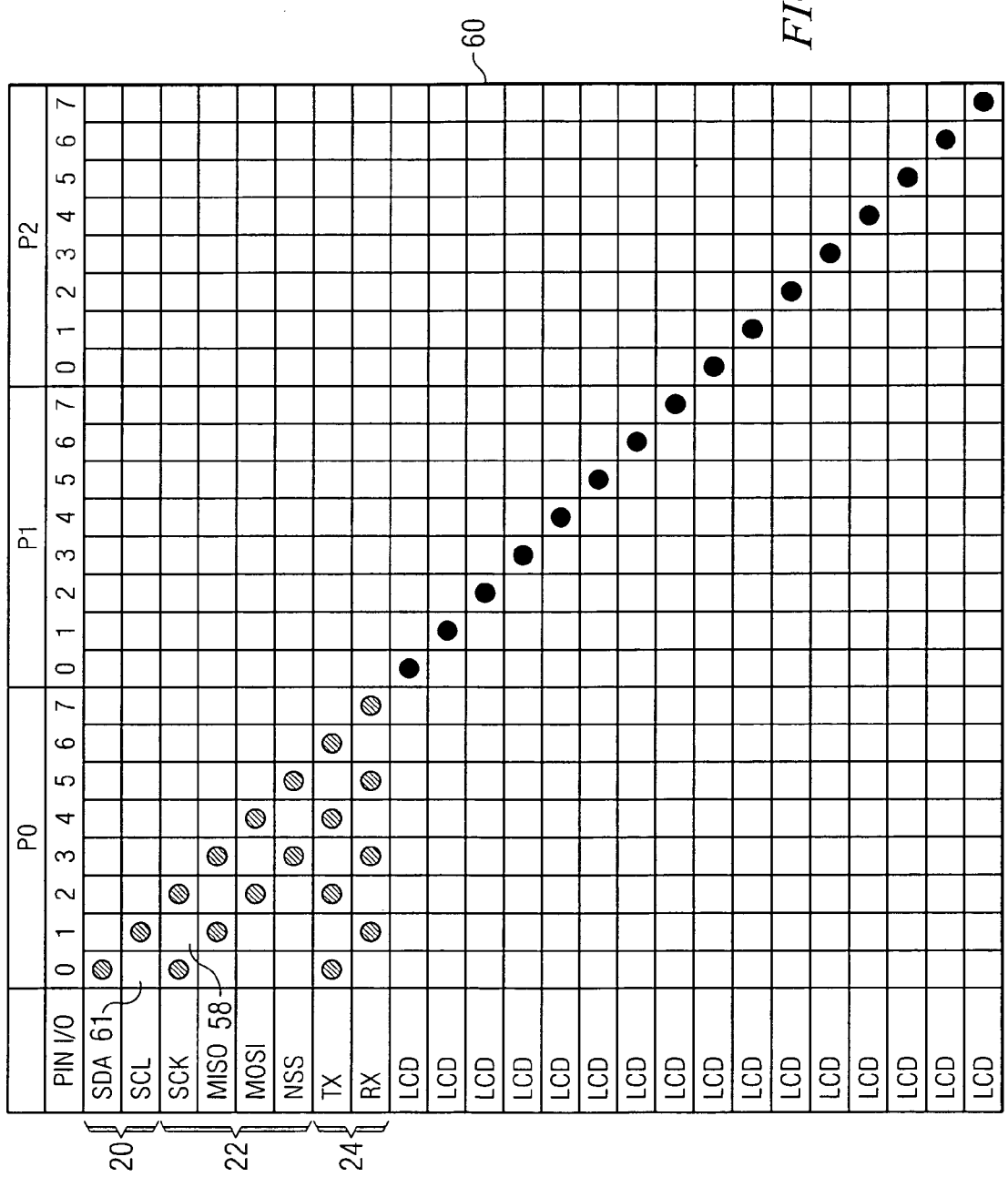

This process is more fully illustrated in FIGS. 12a and 12b wherein the assignment of pins when ports are dedicated to an LCD function is shown. In this case, each of the circles shown in FIG. 12a indicate pins which may be assigned to an internal digital signal by the cross-bar device. However, as shown in FIG. 12b, when the LCD enable signal is applied, all of the blackened circles are dedicated to the LCD driver pins and may no longer have an internal digital signal assigned thereto. In the present description of FIG. 12b, these include the pins associated with port P1 and port P2. In further embodiments, only the pins assigned to port P2 could be dedicated to the LCD driver or each of the ports could be dedicated to the LCD driver as desired by the user programming the cross-bar switch device. The cross-hatched circles may still be assigned to an internal digital signal Referring now to FIG. 13, there is illustrated one manner for controlling the cross-bar switch 310 wherein the LCD driver 1010 and the internal digital input signals from a number of digital functions 1302 are each connected to the cross-bar switch 310. The LCD driver 1010 and the digital functions 1302 providing inputs to the cross-bar switch are all connected to a multiplexer 1304. The multiplexer 1304 is responsive to an LCD enable signal 1306. The multiplexer 1304 provides outputs of either the LCD signals from the LCD driver 1010 or the internal digital signals from the digital functions 1302. When the LCD enable signal is at a first logical level, the LCD driver 1010 provides LCD signals to the cells 1308 of the cross-bar switch 310. In this case the internal digital signals from the digital functions 1302 are locked out and not provided to the cross-bar switch 310 and thus may not be provided at output pins 1310. When the LCD enable signal 1306 is at a second logical level the inputs from the LCD driver 1010 are locked out by the multiplexer 1304, and the internal digital signals from the digital functions 1302 are provided to the cells 1308 of the cross-bar switch 310. The LCD signals or internal digital signals provided to the cells 1308 are then provided to the output pins 1310 of the cross-bar switch 310.

The cells 1308 are controlled in the manner described herein above such that the higher priority input signals are assigned to a first input pin and the subsequent priority digital input signals are assigned to the next input pin as necessary when the internal digital signals are provided from digital functions 1302. When the LCD inputs are provided to the cells 1308, each input signal from the LCD driver 1010 is assigned to an output pin 1310 in a one-to-one ratio. The control of the output pins is such that each LCD signal is assigned to one output.

Figure 14:
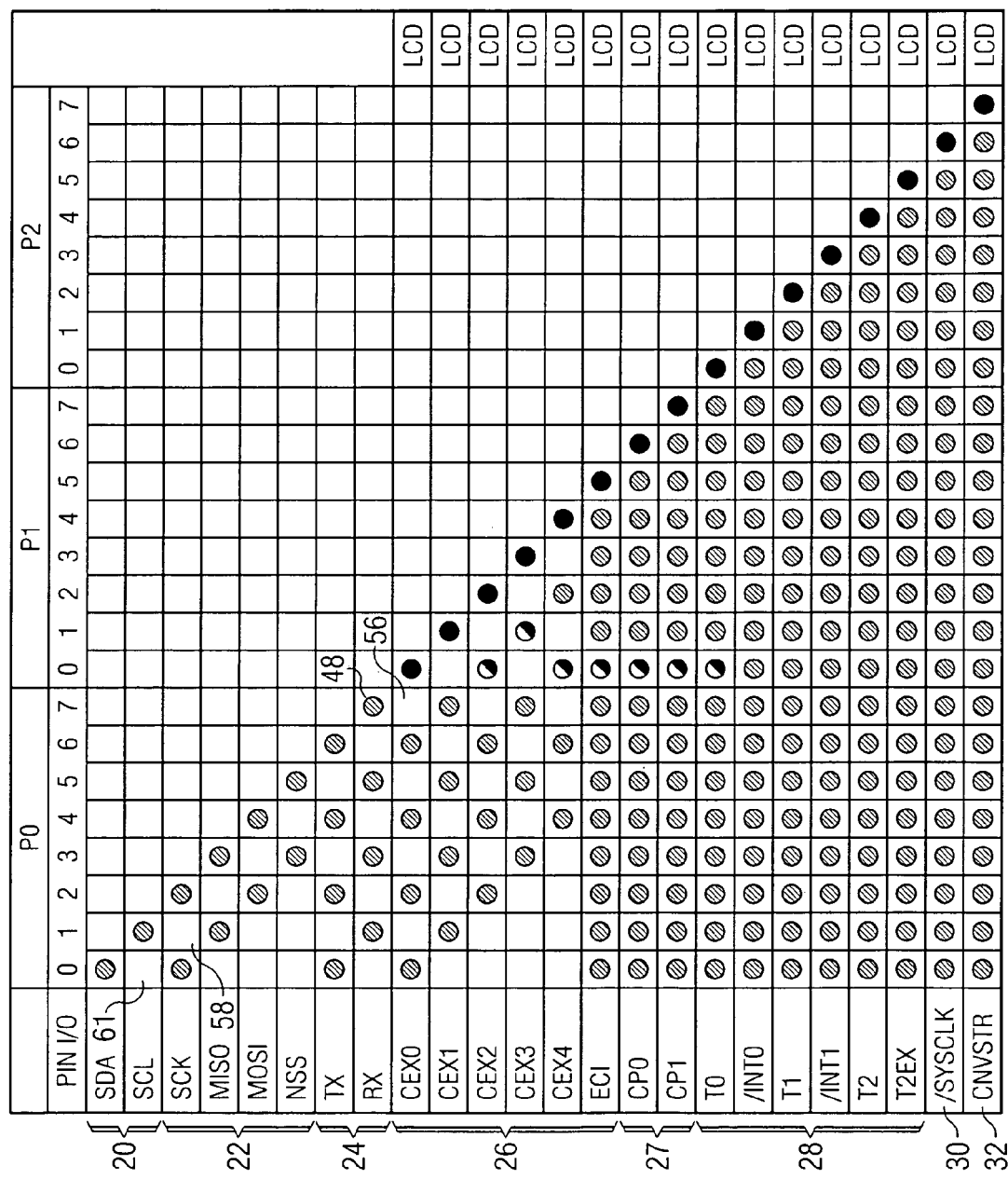
FIG. 14 illustrates an alternative embodiment for the priority assignment of internal digital signals and LCD signals to the cross-bar decoder of the present disclosure.

Referring now to FIG. 14, there is illustrated an alternative embodiment for assigning output pins from ports P0, P1 and P2 to both LCD and internal digital signals. In the first case illustrated by FIG. 14 when the LCD enable signal has not established that the LCD signals are to be assigned to ports P1 and P2 and the internal digital signals are provided to the crossbar switch, the assignment of internal digital signals to output pins of the cross-bar switch occurs in a similar manner as described with respect to FIG. 2 wherein each of the circles illustrated in FIG. 14 comprises a pin to which an internal digital signal maybe assigned. In the embodiment illustrated in FIG. 14, the internal digital signals represented by reference numerals 26, 27, 28, 30 and 32 may be assigned to output pins in port P0 as long as these pins have not been assigned to higher priority signals. The assignment of the completely darkened circles in FIG. 14 to the LCD driver only removes output pins of port 1 and port 2 from being assigned to signals 26, 27, 28, 30 and 32. This is indicated by the circles which are half darkened and half cross-hatched. Thus, if all of the output pins of a particular port are not assigned to use by the LCD driver, all remaining internal digital signals may be assigned to remaining output pins until output pins are no longer available.

Figure 15:
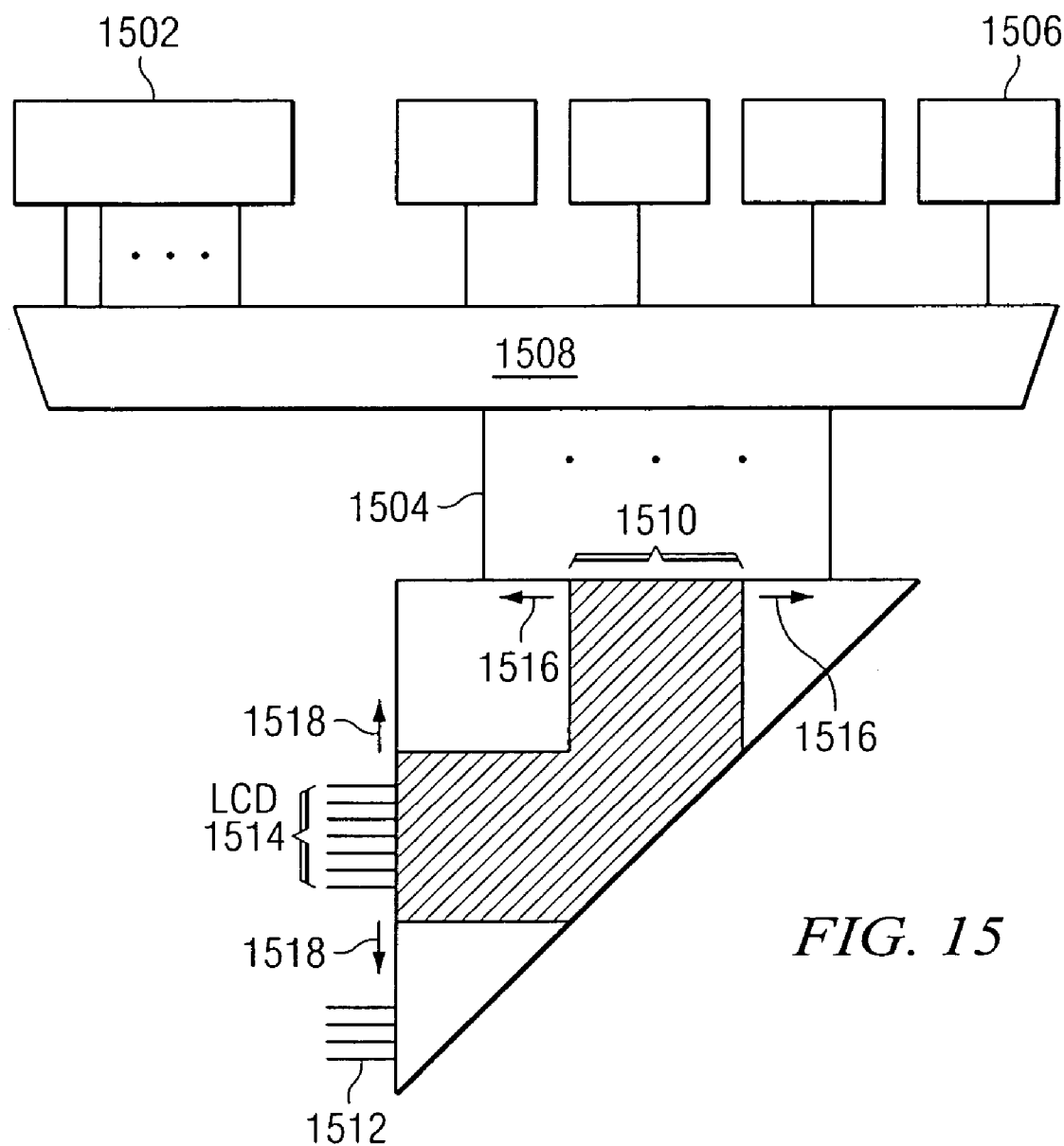
FIG. 15 illustrates the manner in which the LCD input pins and output pins of the crossbar switch may be moved with respect to each other.

FIG. 15 illustrates the manner in which the LCD driver 1502 may be connected to any number of inputs 1504 or outputs 1512 of the crossbar switch. FIG. 15 illustrates the LCD driver 1502 and digital function inputs 1506 connected to the multiplexer 1508. The multiplexer 1508 multiplexes the signals input from the digital functions 1506 and the LCD driver 1508 to various inputs 1504 of the crossbar switch. As shown in FIG. 15, the group of input pins encompassed in the area 1510 have the LCD signals applied thereto such that the output pins 1512 represented by the area 1514 provide the output of the LCD signals from the LCD driver 1502. It should be noted that the multiplexer 1508 may connect the LCD signals to any input pins 1504 of the crossbar switch. Thus, the input pins in the area 1510 may be moved in either direction as indicated by the arrows 1516. When the input pins move in the directions indicated by the arrows 1516, the output pins 1512 to which the LCD signals are-applied also move on the crossbar matrix in the directions indicated by the arrows 1518. Thus, as the input pins 1504 to which LCD input signals are applied move left and right in FIG. 15, the corresponding output pins for the LCD signals move up and down as indicated.

Although the preferred embodiment has been described in detail, it should be understood that various changes, substitutions and alterations can be made therein without departing from the spirit and scope of the invention as defined by the appended claims.

What is claimed is:

1. A circuit for assigning digital resources and a liquid crystal display (LCD) driver to pins of an integrated circuit, comprising:
   a plurality of pins of said integrated circuit;
   a microprocessor formed in said integrated circuit;
   a plurality of digital resources formed in said integrated circuit having a plurality of digital resource outputs, one or more thereof uniquely associated with each of said digital resources;
   an LCD driver formed in said integrated circuit and having a plurality of LCD driver outputs; and
   a cross-bar matrix having a plurality of cross-bar matrix signal inputs coupled respectively to said digital resource outputs and said LCD driver outputs, and a plurality of cross-bar matrix signal outputs coupled to said integrated circuit pins, said cross-bar matrix controlled by said microprocessor for coupling said ones of said cross-bar matrix signal inputs to different ones of said cross-bar matrix signal outputs, whereby said digital resource outputs and said LCD driver outputs can be coupled selectively to different pins under control of said microprocessor and with said cross-bar matrix configured to uniquely associate each of said LCD driver outputs with only one of said cross-bar matrix outputs and, when the functionality of said LCD driver is coupled to said pins, said digital resources are restricted from being coupled to any cross-bar matrix signal outputs coupled to said LCD driver outputs; and
   wherein said digital resource outputs and said LCD driver outputs occupy a sum total of said cross-bar matrix inputs to said cross-bar matrix that exceeds the number of said cross-bar matrix signal outputs thereof.

2. The circuit of claim 1, wherein said cross-bar matrix includes a plurality of cells, each said cell being identically constructed.

3. The circuit of claim 1, wherein said cross-bar matrix is constructed as a plurality of rows associated with said signal inputs, and a plurality of columns associated with said signal outputs, and each cell of a row is controlled by said microprocessor for coupling or not coupling digital resources at a respective signal input to a signal output.

4. The circuit of claim 3, wherein each said cell is individually controlled by said microprocessor.

5. The circuit of claim 3, wherein each row of said cross bar matrix includes a register with a plurality of outputs, each said output controlling operation of a respective cell in a row.

6. The circuit of claim 1, wherein each said row is associated with a signal output and each said column is associated with a signal input, whereby said cross-bar matrix is adapted for coupling signals there through in a bidirectional manner.

7. The circuit of claim 1, wherein responsive to a signal at a first logical level the LCD driver is coupled to a portion of the plurality pins and the portion of the pins may no longer be coupled to the digital resources.

8. The circuit of claim 7, wherein responsive to a signal at a second logical level only the digital resources are coupled to the plurality pins and the LCD driver are not assigned to the plurality of pins.

9. The circuit of claim 1, further including a multiplexer coupled to at least a portion of said digital resources and the outputs of said LCD driver, said multiplexer coupling either the at least the portion of the digital resources or the outputs of said LCD driver to the at least a portion of said plurality of pins.

10. The circuit of claim 9, wherein the multiplexer further couples the digital resources to the at least the portion of said plurality of pins responsive to a signal at a first logical level and couples the outputs of the LCD driver to the at least the portion of said plurality of pins responsive to a signal at a second logical level.

11. The circuit of claim 9, wherein the at least a portion of the digital resources may be assigned to other output pins when the outputs of said LCD driver are coupled to the at least the portion of said plurality of pins.

12. A cross-bar matrix, comprising:
a plurality of matrix cells arranged in rows and columns, each said row of cells associated with a common signal input, and each column of cells associated with a common signal output;
each said cell having a control input for controlling whether the cell is to couple a signal on the associated common signal input to a common signal output associated with the cell, whereby select ones of the common signal inputs of a row can be coupled to a select one of the common signal outputs; and
an enable input for controlling whether at least a portion of said plurality of cells couple select signals on the associated common signal input to an associated common signal output associated with the respective cell or couple a plurality of liquid crystal display (LCD) drive signals on a corresponding plurality of the common signal inputs to corresponding and respective signal outputs associated with the respective cell;
wherein each of said LCD drive signals is uniquely associated with a defined one of the columns and the associated common signal output such that only a single matrix cell is required for the row associated with the common signal input associated with a respective one of the LCD drive signals;
wherein the enable input, when selecting the plurality of LCD signals on the corresponding plurality of common signal inputs, restricts any of the other of the common signal inputs from being connected to the ones of the common signal outputs associated with the LCD drive signal, wherein the enable input is operable to dedicate that portion of the matrix cells associated with the LCD drive signals to a LCD functionality, but where the ones of the matrix cells restricted from being connected to the ones of the common signal outputs associated with the LCD functionality can still be associated with other of the common signal inputs.

13. The cross-bar matrix of claim 12, wherein each said cell of a row is coupled to a data signal line for receiving the same data signal, and each cell in a row is coupled to a different control line for controlling whether the cells in the row are to couple the data signal to a respective common signal output.

14. The cross-bar matrix of claim 13, wherein said control lines are coupled to a circuit that enables only one control line in a row at a time.

15. The cross-bar matrix of claim 13, wherein each cell of a row is coupled to an output enable signal line for receiving an output enable signal from the digital resources, and said control line controls whether the cells in the row are to couple the output enable signal to a respective common signal output.

16. The cross-bar matrix of claim 13, wherein each said cell of a column has a data signal output coupled to a logic circuit for providing a single output corresponding to a selected cell of the column.

17. The cross-bar matrix of claim 16, further including an enable circuit coupled between said logic circuit and a pin associated with the respective column, said enable circuit being controlled to enable or disable said data signals from being coupled to said respective pin.

18. The cross-bar matrix of claim 13, wherein each cell in a row includes a circuit for receiving a data signal from a pin associated with the respective column, and said control line controls whether said data receiving circuit is to couple received data from said matrix to the data resource.

19. The cross-bar matrix of claim 18, wherein each cell of a row includes a data receive output line coupled to a logic circuit, said logic circuit providing an output to the data resource of the cell in the row that was enabled by said control line.

20. The circuit of claim 12, wherein responsive to a signal at a first logical level on the enable input, the LCD drive signal is coupled to the common signal output and the other common signal inputs associated with the select signals may no longer be coupled to the common signal output.

21. The circuit of claim 20, wherein responsive to a signal at a second logical level, only the select signals are capable of being coupled to the common signal outputs and the LCD drive signals are not coupled to the common signal outputs.

22. The circuit of claim 12, further including a multiplexer for coupling either the select signals or the LCD drive signals to the common signal outputs.

23. The circuit of claim 22, wherein the multiplexer further couples the select signals to the common signal outputs responsive to a logic signal on the enable input at a first logical level and couples the LCD drive signals to the common signal outputs responsive to a logic signal on the enable input at a second logical level.

24. The circuit of claim 22, wherein the select signals may be assigned to other common signal outputs when the LCD drive signals are coupled to the common signal outputs.

25. A circuit for assigning digital resources and a Liquid Crystal Display (LCD) driver to pins of an integrated circuit, comprising:
a cross-bar matrix having a plurality of signal inputs coupled respectively to said digital resources and the output of said LCD driver, and a plurality of signal outputs coupled to the integrated circuit pins, said cross-bar matrix controlled by said microprocessor for coupling said ones of said signal inputs to different said signal outputs, whereby said digital resources and LCD driver can be coupled to different pins under control of said microprocessor but where the LCD driver has a plurality of LCD drive outputs, each having a predetermined and unique association with predetermined ones of the different pins, whereby said digital resources are restricted from being coupled to any signal outputs coupled to the LCD driver outputs after coupling of the LCD driver thereto, such that coupling of the LCD driver to the predetermined ones of the pins removes such from being available for connection to said digital resources.

26. The circuit of claim 25, wherein said cross-bar matrix includes a plurality of cells, each said cell being identically constructed.

27. The circuit of claim 25, wherein said cross-bar matrix is constructed as a plurality of rows associated with said signal inputs, and a plurality of columns associated with said signal outputs, and each cell of a row is controlled by said microprocessor for coupling or not coupling digital resources at a respective signal input to a signal output.

28. The circuit of claim 27, wherein each row of said cross bar matrix includes a register with a plurality of outputs, each said output controlling operation of a respective cell in a row.

29. The circuit of claim 25, wherein each said row is associated with a signal output and each said column is associated with a signal input, whereby said cross-bar matrix is adapted for coupling signals therethrough in a bidirectional manner.

30. The circuit of claim 25, wherein responsive to a logic signal at a first logical level the LCD driver is coupled to a portion of the plurality pins and the portion of the pins may no longer be coupled to the digital resources.

31. The circuit of claim 25, wherein responsive to a logic signal at a second logical level only the digital resources are coupled to the plurality pins and the LCD driver are not assigned to the plurality of pins.

32. The circuit of claim 25, further including a multiplexer coupled to at least a portion of said digital resources and the outputs of said LCD driver, said multiplexer coupling either the at least the portion of the digital resources or the outputs of said LCD driver to the at least a portion of said plurality of pins.

33. The circuit of claim 32, wherein the multiplexer further couples the digital resources to the at least the portion of said plurality of pins responsive to a signal at a first logical level and couples the outputs of the LCD driver to the at lease the portion of said plurality of pins responsive to a signal at a second logical level.

34. The circuit of claim 32, wherein the at least a portion of the digital resources may be assigned to other output pins when the outputs of said LCD driver are coupled to the at least the portion of said output pins.

* * * * *